United States Patent
Doerfel et al.

(10) Patent No.: US 8,213,479 B2
(45) Date of Patent: Jul. 3, 2012

(54) HIGH POWER DIODE LASER HAVING MULTIPLE EMITTERS AND METHOD FOR ITS PRODUCTION

(75) Inventors: Falk Doerfel, Plymouth, MI (US); Stefan Heinemann, Plymouth, MI (US); Reiner Witte, Plymouth, MI (US)

(73) Assignee: Fraunhofer USA, Inc., Plymouth, MI (US)

( * ) Notice: Subject to any disclaimer, the term of this patent is extended or adjusted under 35 U.S.C. 154(b) by 1463 days.

(21) Appl. No.: 11/680,761

(22) Filed: Mar. 1, 2007

(65) Prior Publication Data

US 2008/0084905 A1    Apr. 10, 2008

Related U.S. Application Data

(60) Provisional application No. 60/778,806, filed on Mar. 3, 2006.

(51) Int. Cl.
*H01S 5/00* (2006.01)
(52) U.S. Cl. .................................................. 372/50.12
(58) Field of Classification Search ............... 372/50.12, 372/107, 109
See application file for complete search history.

(56) References Cited

U.S. PATENT DOCUMENTS

| 5,099,488 A | 3/1992 | Ahrabi et al. |
| 5,715,264 A | 2/1998 | Patel et al. |
| 5,875,205 A * | 2/1999 | Spaeth et al. ............. 372/50.23 |
| 6,337,873 B1 * | 1/2002 | Goering et al. ............. 372/69 |
| 2003/0048819 A1 | 3/2003 | Nagano et al. |
| 2004/0114648 A1 | 6/2004 | Nagano et al. |

OTHER PUBLICATIONS

European Search Report, Application No. EP 06 11 3152, dated Sep. 4, 2006.

* cited by examiner

*Primary Examiner* — Aaron Strange
(74) *Attorney, Agent, or Firm* — Renner, Otto, Boisselle & Sklar, LLP

(57) ABSTRACT

The invention discloses a high power laser diode comprising a plurality of laser light emitters (2) and a plurality of light collimating means (33), wherein each of the laser light emitters (2) defines, in a direction perpendicular to a direction of propagation (32) of an output laser beam, a fast axis (y) and a slow axis (x), and wherein each of the light collimating means is associated with a laser light emitter and configured for collimating the output laser beam at least in a fast axis (y) direction. In order to enable a simple and cost-efficient assembly of the diode laser with collimating means, having a layered structure consisting of a plurality of plane-parallel substrates. For this purpose, the diode laser comprises planar substrate means (10, 30) which serves to precisely define a distance between a respective laser light emitter (2) and an associated light collimating means to the order of one or several millimetres and to support the collimating means (33) such that the optical axis of said laser light emitters are parallel to each other and for defining a precise location of emitters on the planar substrate (10), preferably at predetermined distance in fast axis direction between said laser light emitters. The collimating means is an array or multiple single of micro-optical lenses having a rear side which is bonded to the upper surface of the planar spacer means. The submounts of the light emitters (2) are mounted to the planar substrate means (10, 30) and to a heatsink (6).

30 Claims, 14 Drawing Sheets

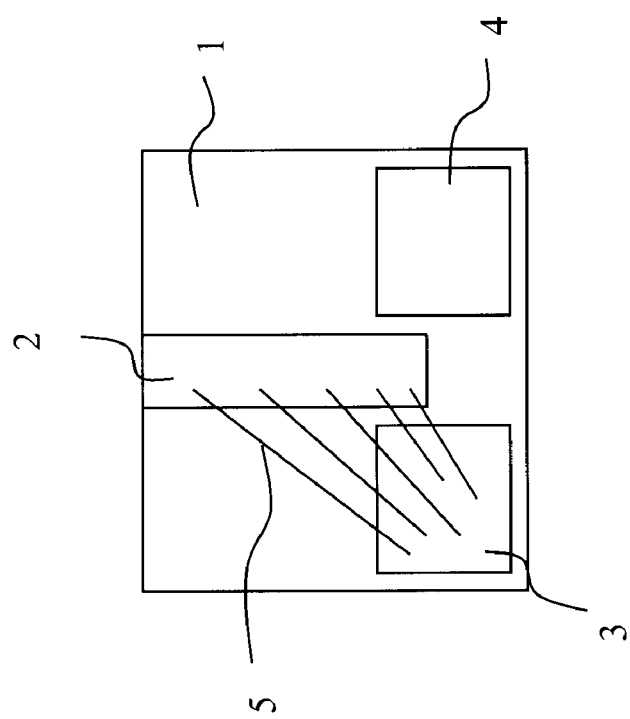
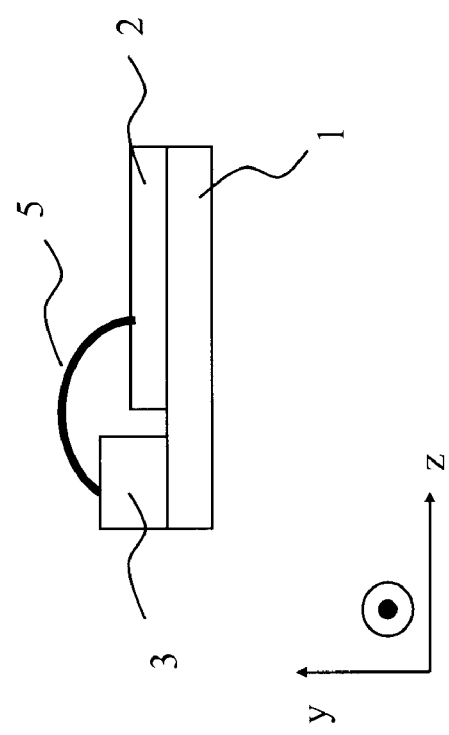
Fig. 1b
Fig. 1a

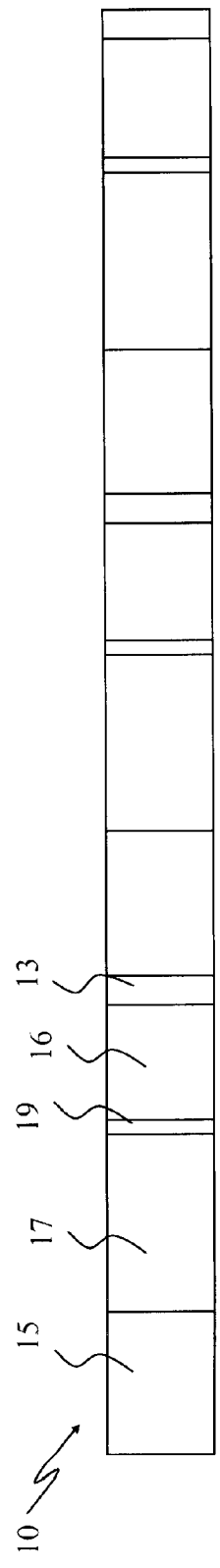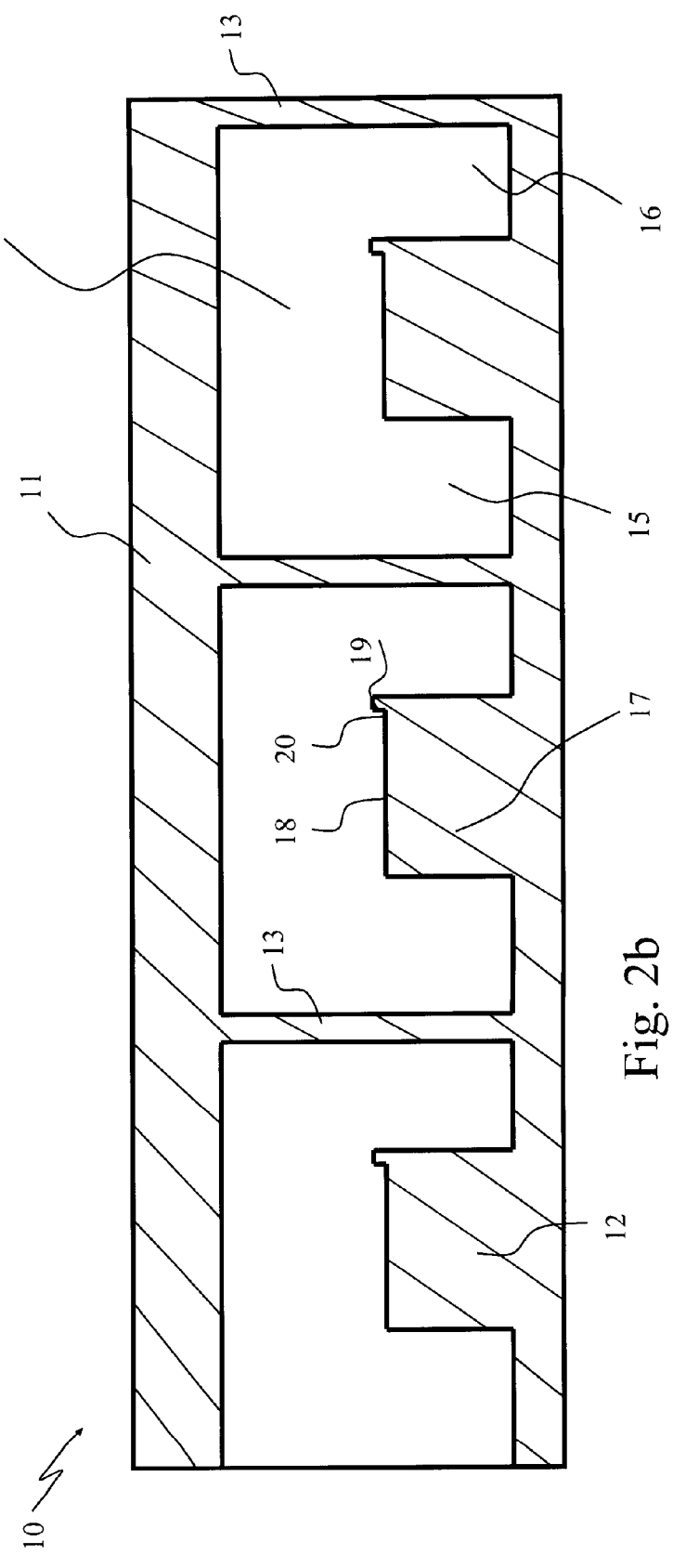
Fig. 2a
Fig. 2b

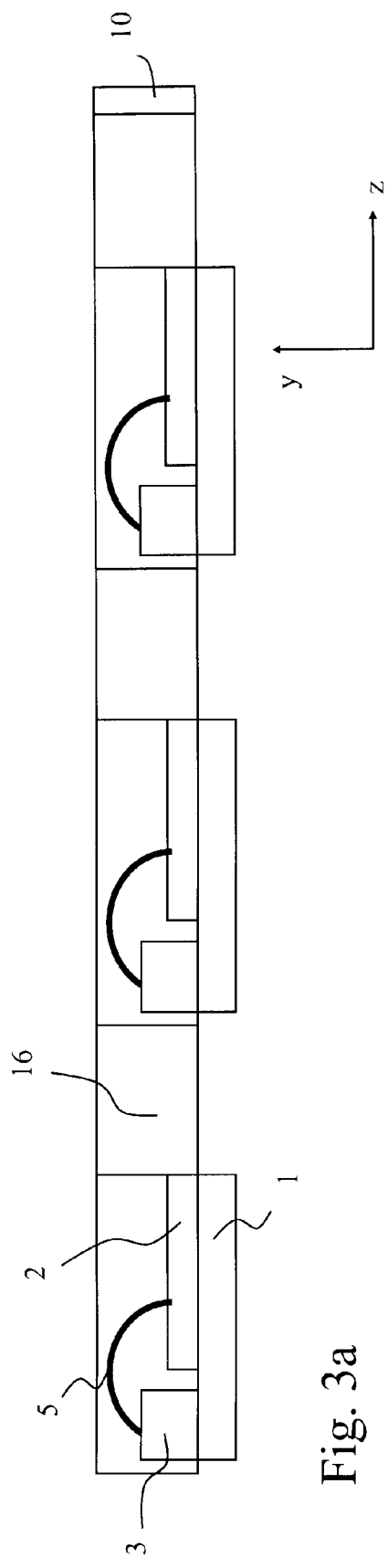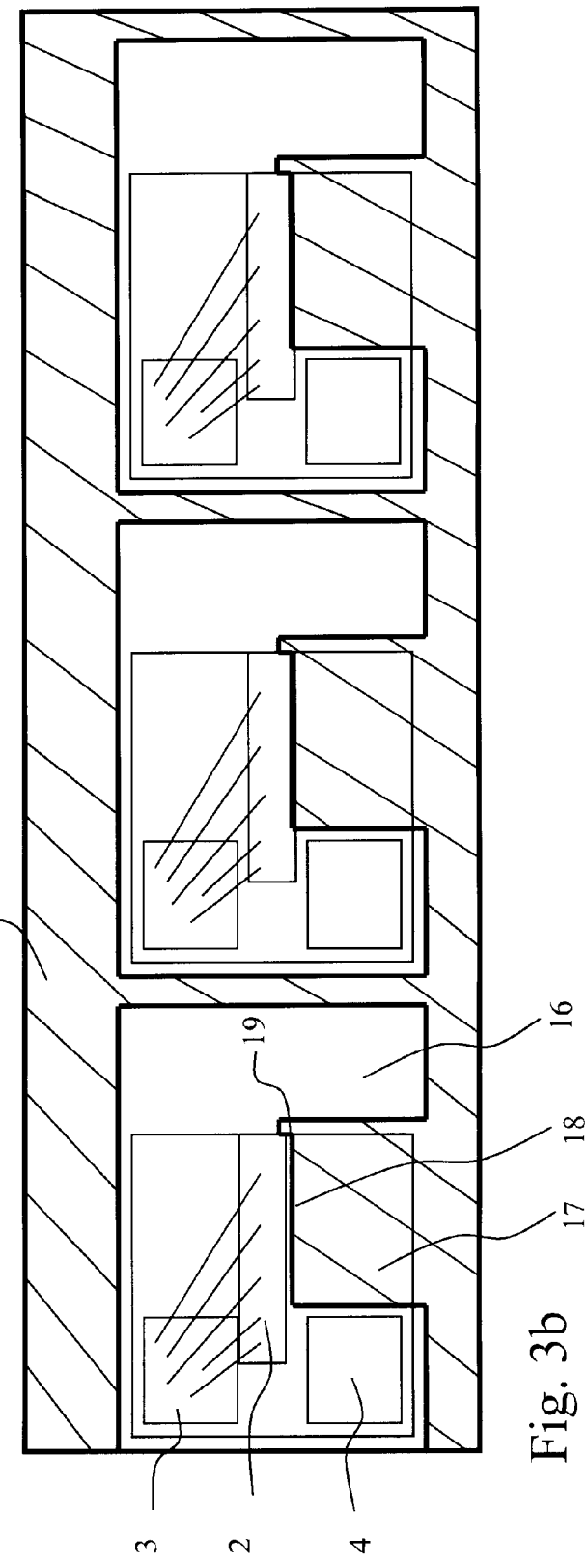

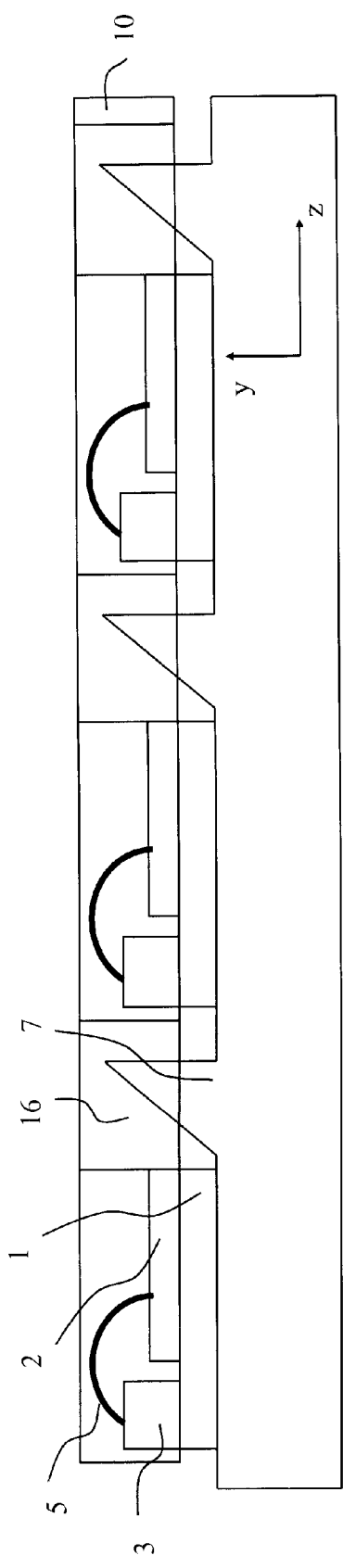
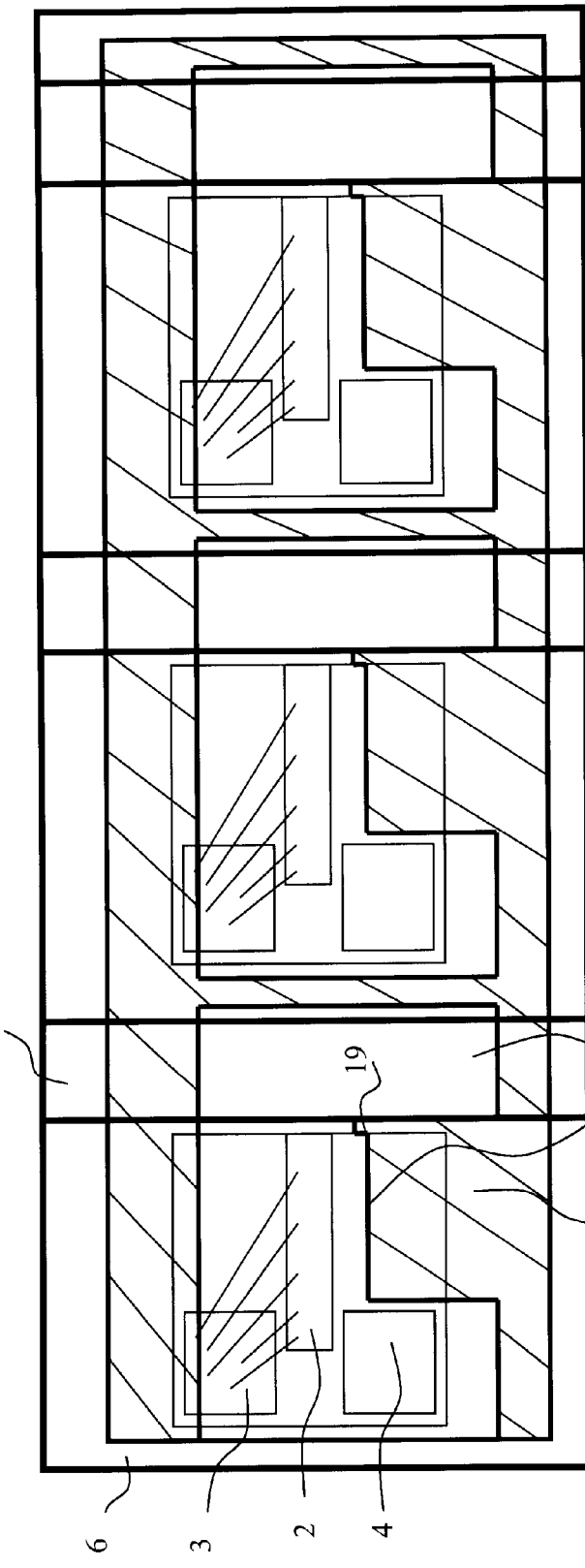
Fig. 4a
Fig. 4b

HIGH POWER DIODE LASER HAVING MULTIPLE EMITTERS AND METHOD FOR ITS PRODUCTION

The present application is related to and claims benefit under 35 U.S.C. §119 of U.S. Provisional Patent Application No. 60/778,806, filed on Mar. 3, 2006 with the title 'High Power Diode Laser Having Multiple Emitters and Method for its Production' the whole content of which is hereby incorporated by reference.

FIELD OF THE INVENTION

The present invention relates in general to high power diode laser and relates in particular to a high power diode laser having multiple emitters and a method for manufacturing the same.

BACKGROUND OF THE INVENTION

Most high power diode lasers are edge emitting semiconductors, with the laser emitted from one facet. Typical dimensions of one diode laser are a facet of 500 microns width and 100 microns height with a length between 0.6 mm to 3 mm. The optical brightness of the diode laser is defined by its internal structure. Parallel to the pn-junction (fast axis) the emission is diffraction limited and emerging from an aperture of about 1 micron with a divergence of typical 30 degrees (half angle for 1/e2), in a direction parallel to the mounting surface of the diode laser. Modifications of the internal structure of the diode laser allow lower angles of divergence, e.g. by increasing the aperture (so called Large Optical Cavity (LOC) structures). In the axis perpendicular to the pn-junction, the light is emitted from an aperture in the range of several microns to 200 microns with a beam quality defined by the size of the aperture. For typical 3-5 microns large aperture the emission is also diffraction limited in the slow axis, but for larger apertures, the emission is no longer diffraction limited and the beam quality typically decreases with larger aperture. A typical divergence of a 100 micron wide aperture is 4 degrees (half angle for 1/e2).

High power diode lasers with output powers of 100 W and more are realized by arranging multiple edge emitting diode lasers, so called single chips, next to each other in one device, so called array. In such cases, special measures have to be taken to provide for an efficient dissipation of heat generated by the multiple diode lasers.

Alternate structures of high power diode lasers are semiconductor devices with integrated mirrors to deflect the emission parallel to the pn junction to emerge perpendicular to the mounting surface of the diode laser. Vertical Cavity Surface Emitting Lasers (VCSEL) represent another group of devices as well as structures with higher order Distributed Bragg Grating (DBG).

Focusing the light of edge emitting diode lasers to a small spot requires optical elements for collimation and focusing. However, it is noted that the beam quality of such a high power laser diode is highly asymmetric. Typically, in fast axis the beam quality is diffraction limited in fast axis, characterized by $M^2=1$ and in slow axis the beam quality for a 100 micron broad aperture is in the range of $M^2=16$. The issue of asymmetric beam quality in fast and slow axis is much more severe for high power arrays, with multiple single chips arranged in one semiconductor next to each other in slow axis direction. At a beam quality of $M^2=1$ in fast axis, the beam quality in slow axis can decrease to $M^2=1,000$. Because the output laser beam is highly asymmetric, typically two collimating steps are performed in the prior art. Typically first micro-optical lenses are used for collimating the highly divergent beam in fast axis and secondly, collimating lenses for slow axis collimation are deployed resulting in a beam collimated in both axes that can subsequently be focused with one or more lenses to a small spot. Nevertheless, the symmetry of said collimated output laser beams is not satisfactory for many applications. Accordingly, there exists a need to provide simple and cost-efficient solutions to enable high power laser diodes to output laser beams of high beam quality, in particular high symmetry.

To optimize the brightness, defined as the power from a given aperture emitted in a specific space angle, the beam quality must be symmetrized in fast and slow axis. Several concepts have been developed for diode laser arrays in the past. State of the art solutions use refractive or reflective optics to cut the emission in slow axis in several sections with subsequent rearranging in fast axis. Because of the high divergence angle in the fast axis direction, all these approaches dispose a collimating lens for fast axis collimation at very short distances from the emitting facet of the laser diodes, i.e. make use of collimating lenses of short focal length for fast axis collimation. This approach usually requires precise alignment of an array of multiple micro-optical lenses in six axes, which makes the whole setup relatively complex and expensive. Nevertheless, a substantial loss of beam quality is experienced because of unavoidable tolerances in the parts, such as smile of the lens or diode array, as well as in the alignment of the laser light emitter(s) to the associated optical component(s).

For single chips symmetrizing the beam quality has not been explored. The high effort for precision alignment of the single chip or the respective optics and the associated costs prohibit further exploration.

US 2003/0048819 A1 discloses a laser diode array comprising a plurality of multi-cavity laser diode chips fixed side by side. According to a first embodiment, shown in FIG. 11 to 13, the laser diode chips are soldered onto a substrate. In order to position the laser diode chips, a reference mark is provided of an upper surface or side surface of the substrate. In this embodiment, the laser diode chips are not aligned in fast axis direction. Disclosed is also a second embodiment (FIG. 14 to 16), wherein several of such laser diode arrays are stacked one upon the other. In this embodiment, the laser diode chips are aligned in fast axis direction. In this embodiment, the substrate, which is a heat sink made of copper, has a stepped profile. At the front face of each step there is provided a recess for preventing interference with the laser diode array fixed to the lower substrate. At the front face of each step a collimator lens array is fixed.

The precise distance between the laser diode chips and the lens array relies on exact positioning of the laser diode chips with regard to the front edge of the recesses. The tolerances caused by machining the stepped profile and the recesses are too high for precise fast axis collimation.

US 2004/0114648 A1 discloses laser diode array corresponding to the second embodiment of afore-mentioned US 2003/0048819 A1.

U.S. Pat. No. 5,715,264 discloses the stacking of laser diode submounts in fast axis direction. At the front facet of the laser diode chips there is provided a cylindrical microlens U.S. Pat. No. 5,099,488 discloses a laser array sub mounts structure, wherein the laser diode chips are mounted upright and close to each other. A lens array with a period that is equal to the period of the laser diode chips is disposed in front of the front facets of the laser diode chips. Precise alignment of the lens array to the laser diode array is not disclosed.

SUMMARY OF THE INVENTION

It is an object of the present invention to provide a high power laser diode having a simple and cost-efficient configuration enabling a minimum amount and less tight tolerances of down-stream optics used for collimating output laser beams of the laser diode. It is a further related object of the present invention to provide a high power laser diode having a simple and cost-efficient configuration enabling assembly of the laser diode in a precise and cost-efficient manner. It is a further object of the present invention to provide a high power laser diode posing less demanding requirements with regard to heat dissipation. According to a further aspect of the present invention corresponding methods for manufacturing the above high power laser diode are to be provided.

According to a first aspect, the present invention provides a high power laser diode comprising a plurality of laser light emitters and a plurality of light collimating means, wherein each of said laser light emitters define, in a direction perpendicular to a direction of propagation of an output laser beam, a fast axis (hereinafter designated by letter 'y') and a slow axis (hereinafter designated by a letter 'x'), and wherein each of said light collimating means is associated with a laser light emitter and configured for collimating said output laser beam at least in a fast axis (y) direction. According to the present invention the high power diode laser further comprises a planar substrate means for precisely defining a distance between a respective laser light emitter and an associated light collimating means and for supporting said collimating means, wherein said planar substrate means is configured a) for aligning said plurality of laser light emitters to each other such that the optical axis of said laser light emitters are parallel to each other and b) for defining a predetermined distance in fast axis direction between said laser light emitters.

The approach according to the present invention is in fundamental contrast to conventional approaches according to which the collimating lens is provided at a short distance as possible to the emitting facet of the laser diodes in order to avoid a relatively large diameter of the output laser beam in the fast axis direction. In contrast, according to the present invention, the collimating lens is provided at a relatively large distance to the emitting facet of the laser diodes, which can be of the order of one mm or even several millimetres, such as three millimetres according to a preferred embodiment of the present invention.

Surprisingly, the approach according to the present invention automatically results in various advantages. Inter alia, the adjustment of the high power laser diode according to the present invention is much simpler and less critical, in particular because the tolerances are less demanding for an accurate placement of the downstream collimating lenses in a simple manner. Another advantage is that according to the present invention heat dissipation is much less demanding as compared to conventional approaches using so-called laser diode arrays where multiple densely stacked diode lasers emit much heat per area. In contrast, according to the present invention the laser light emitters are arranged at relatively large intervals, so that heat generated by the laser light emitters can be dissipated easily using conventional heat-spreading, in particular passively-cooled heat sinks, to which the laser light emitters are mounted. Another advantage is that the layered structure of the high power laser diode according to the present invention makes assembly thereof much easier. At each step of laser diode assembly the module to be assembled exhibits a plane bottom surface and a plane top surface that are in parallel with each other. In particular, the top surface has a plurality of plane abutment portions on which a subsequent layer can be put easily and precisely such that the top surface of the subsequent layer automatically is in parallel or in alignment with the bottom surface of the module. Therefore, according to the present invention during assembly less degrees of freedom prevail so that adjustment of the components of the high power laser diode module is substantially simplified. In particular, when putting a subsequent layer or substrate on top of the module already assembled the subsequent layer or substrate can be adjusted simply by shifting the subsequent layer or substrate with regard to the module already assembled in one or two dimensions, i.e. along the fast and/or slow axis, and/or by rotating the subsequent layer or substrate with regard to the module already assembled about a central axis of rotation, which is perpendicular to the top surface of the module already assembled.

As the planar substrate means has two surfaces which are parallel to each other (in other words: the planar substrate means is preferably a plane-parallel substrate) this enables to automatically align all laser light emitters to each other such that the optical axes of all laser light emitters are parallel to each other. To this aim the laser light emitters are aligned with respect respect to a surface of the planar substrate means, using either features of the planar substrate means or of another substrate or carrier, which is aligned to a surface of the planar substrate means, e.g. by bonding.

According to the present invention the planar substrate means is provided with features to enable disposing the laser light emitters at predetermined distances in fast axis direction, in accordance with predetermined specifications to be satisfied by the high power laser diode. Most preferably, all distances between the laser light emitters in the fast axis direction are the same, so that all laser light emitters are stacked at equidistant spacings along the fast axis direction. Thus, the laser beams can form a seamless stripe-shaped output laser beam or a plurality of laser beams can be output in an interleaved manner and/or in a predetermined geometry, e.g. forming a long line, a square, a rectangle, a star, e.g. in correspondence with a downstream optical device for further imaging or conducting the output laser beam(s) such as an optical fibre or array of optical fibres.

According to a further embodiment of the present invention the planar substrate means comprises a substrate, which is transparent for said output laser beams or comprises a plurality of cut-outs to pass the multiple output laser beams. Such a substrate has a first surface and a second surface opposite to and in parallel with said first surface, wherein the first surface abuts to at last one plane spacer alignment surface, which is perpendicular to said direction of propagation, and wherein the second surface abuts to a plane rear side of the collimating means. Thus, the spacer alignment surface guarantees an orientation of the spacer means in perpendicular to the direction of beam propagation and in parallel to the alignment substrate, which can be used for mounting laser diode submounts and/or related components of the diode laser according to the present invention. Accordingly, the laser diode generally has a layered structure consisting of multiple plane-parallel substrates, of which one, namely the alignment substrate, may be used according to the invention to align the laser diode chips and/or laser diode submounts and/or other related components of the diode laser. It is noted that the planar substrate means and the planar alignment substrate can be the same substrate or can be two separate substrates in direct contact with each other or disposed at a given spacing and in parallel with each other.

According to another embodiment, the planar substrates, in particular a planar spacer substrate, the alignment substrate, the laser diode submounts and collimating means are mounted using bonding techniques, such as fusion bonding, soldering and laser welding. Such bonding techniques are use in particular for bonding the first surface and the at least one plane spacer alignment surface as well as the second surface and the plane rear side of the collimating means. The benefits of such bonding techniques are a rigid, mechanically stable and long-lasting bond avoiding the disadvantages of conventional mounting and packaging techniques using adhesives, such as shrinkage, hygroscopic effects and light induced decomposition associated with adhesives.

According to another embodiment, each of the laser light emitters is mounted on a submount, which may include electrical connection means for connecting the laser light emitters. Preferably, the submounts are planar plane-parallel submounts of generally rectangular shape, with the laser diode chips being mounted onto a top surface of the submounts using e.g. soldering. Conveniently, the diode laser chips are mounted such onto the submounts that the direction of beam propagation of an output laser beam is in parallel with the top surface of the submount and/or perpendicular or in parallel with respective side edges of the submount. Thus, by simply aligning the edges of the submount with external stops or other reference means it is possible to align the laser diode chips in a suitable manner.

According to another embodiment, the submounts are mounted on a single carrier at predetermined spacings, most preferably at equidistant spacings, wherein stops are provided for aligning the submounts in fast axis and/or slow axis. The arrangement of the laser diode chips at predetermined or equidistant spacings simplifies the adjustment of downstream optical components for imaging/collimating the output laser beams substantially. In particular, for an optimum output beam quality it is just necessary to dispose the downstream optical components at the same predetermined or equidistant spacings. This can be achieved easily either by using micro-optical components such as micro-lens arrays or the like or by using suitable lens holders having holding features disposed at predetermined or equidistant spacings. The adjustment of the optical components then simply requires shifting all optical components together in a plane perpendicular to the direction of beam propagation and along a fast axis and/or slow axis direction. As these directions are well defined because of the alignment substrate, such an adjustment can be performed easily. Furthermore, for adjustment of the optical components a simple rotation of all optical components together in a plane perpendicular to the direction of beam propagation and about a central axis of rotation, which is in parallel with the direction of beam propagation, is required. As will become apparent to a person skilled in the art, such an adjustment can be performed easily. In particular, such an adjustment is preferably performed before bonding the components of the diode laser assembly according to the present invention together.

According to another embodiment, at least one of the stops is/are provided on a surface of the submount for aligning said last light emitters with edges of the submount. As an alternative at least one of the stops may also be disposed on the carrier to which the submounts are mounted, e.g. a heatsink or a planar alignment substrate. Such alignment stops can be formed as small protrusions on the surface of the submount and/or carrier, with a length sufficient to properly align the submount, laser diode chips and/or other components of the diode laser assembly, before bonding the components together to form the diode laser assembly.

According to another embodiment, the carrier defines a plurality of cut-outs for passing the output laser beams and/or for receiving electrical connection means used for connecting the laser light emitters, wherein at least one stop forms a respective edge of the cut-outs. Such cut-outs can be formed easily using various techniques, such as etching, also selective etching, micro-machining, laser cutting and the like. Preferably, the cut-outs are formed with submicron precision in order to ensure a proper alignment and orientation of the components to be assembled. Alignment is achieved simply by abutment of the component to be assembled to one or more edge(s) of the cut-out.

According to another embodiment, the carrier is a heatsink having a plurality of upright mounting protrusions and cut-outs being disposed on a base in an alternating manner and at predetermined spacings, most preferably at equidistant spacings. The heatsink preferably consists of a material having a high thermal conductivity to support dissipation of heat generated by the laser diode chips.

According to an alternative preferred embodiment, the carrier is a planar substrate, most preferably a semiconductor substrate, wherein the cut-outs are provided using an etching process, micro-machining or laser cutting, wherein the submounts are mounted on at least one heatsink and wherein the semiconductor substrate is supported by the submounts such that the laser light emitters are at least partly received by the cut-outs and aligned by at least one stop forming a respective edge of said cut-outs. As is well-known, semiconductor substrates can be processed with ultra-high precision using common semiconductor processing techniques, such as etching. Accordingly, the cut-outs and edges can be formed easily with submicron precision. At the same time, semiconductor substrate, such as silicon wafers, can be provided as plane-parallel substrates at moderate costs. The two surfaces of the substrate in parallel with each other result in a parallel alignment of substrates bonded to the semiconductor substrate. According to the present invention, preferably both the alignment substrate (supported by the laser diode submounts) and the collimating means, in particular an array of micro-optical lenses having a plane rear side, are bonded to the semiconductor substrate.

According to another embodiment, the heatsink further comprises beam deflecting means for deflecting a respective output laser beam toward the downstream collimating means. The beam deflecting means preferably is unitarily provided with said heatsink, preferably using micro-machining techniques. According to an alternative embodiment, the beam deflecting means may also be provided as a separate optical component manufactured with high precision, to be inserted into a corresponding groove provided in the heatsink. Preferably, the beam deflecting means is a mirror, which is highly reflective at the wavelength of the output laser beams. Such a mirror may be a plane mirror. As an alternative, such a mirror may also perform other optical functions, in particular imaging or collimation of the output laser beams, in which case the mirror surface might be curved in a convex or concave manner or shaped in any other suitable manner.

According to another embodiment, a thickness of the planar substrate means, in particular of the above transparent substrate or semiconductor substrate and/or alignment substrate, along the direction of light propagation is selected such that a fill rate of the output laser beams on a surface of the light collimating means in fast axis direction is less than 100%, more preferably less than 90% and most preferably 50% and 33%, Thus, the downstream collimating means can be of a size substantially larger than the diameter of the output laser beam, which substantially minimizes beam distortion. The above fill rate of 0.5 or 0.33 or any other fill rate defined by the ratio of 1 to an integer number enables interleaving a corresponding total number of output laser beams in the shape of a long line, either in a seamless manner or at regular intervals.

According to another embodiment, each of the laser light emitters is mounted on a submount. In such an embodiment the planar substrate means, in particular the above planer alignment substrate, is configured such that n submounts are stacked in fast axis direction, i.e. aligned along the fast axis direction. The total number n of submounts aligned is determined such as to substantially equal the beam parameter product of the output laser beam(s) in fast axis direction and slow axis direction.

According to another preferred embodiment each of the laser light emitters is a conventional laser diode bar consisting of a plurality of densely stacked laser diodes.

According to another aspect of the present invention, there is provided a method for manufacturing a high power laser diode comprising a plurality of laser light emitters and a plurality of light collimating means. According to the present invention the method further comprises a step of providing planar substrate means as outlined above for precisely defining a distance between a respective laser light emitter and an associated light collimating means and for supporting said collimating means said planar substrate means being configured for aligning said plurality of laser light emitters to each other such that the optical axis of said laser light emitters are parallel to each other and for defining a predetermined distance in fast axis direction between said laser light emitters.

BRIEF DESCRIPTION OF THE DRAWINGS

Hereinafter, the invention will be set forth in exemplary manner and with reference to the accompanying drawings, from which further features, advantages and problems to be solved by the present invention become apparent to a person skilled in the art and wherein:

FIGS. 1a and 1b show a laser diode chip mounted on a submount for use in a high power diode laser according to the present invention in a schematic side view and top view;

FIGS. 2a and 2b show an alignment substrate for aligning a plurality of laser diodes according to a first embodiment of the present invention in a side view and top view;

FIGS. 3a and 3b show the alignment substrate according to FIG. 2a and FIG. 2b supported by and bonded to laser diode submounts according to FIG. 1a and FIG. 1b in a side view and top view;

FIGS. 4a and 4b show the mounting of the alignment substrate and the laser diode submounts on a heatsink according to a first embodiment of the present invention in a side view and a top view;

Throughout the drawings like reference numerals relate to identical or substantially equivalent elements or groups of elements.

DETAILED DESCRIPTION OF PREFERRED EMBODIMENTS OF THE PRESENT INVENTION

Figure 5A:
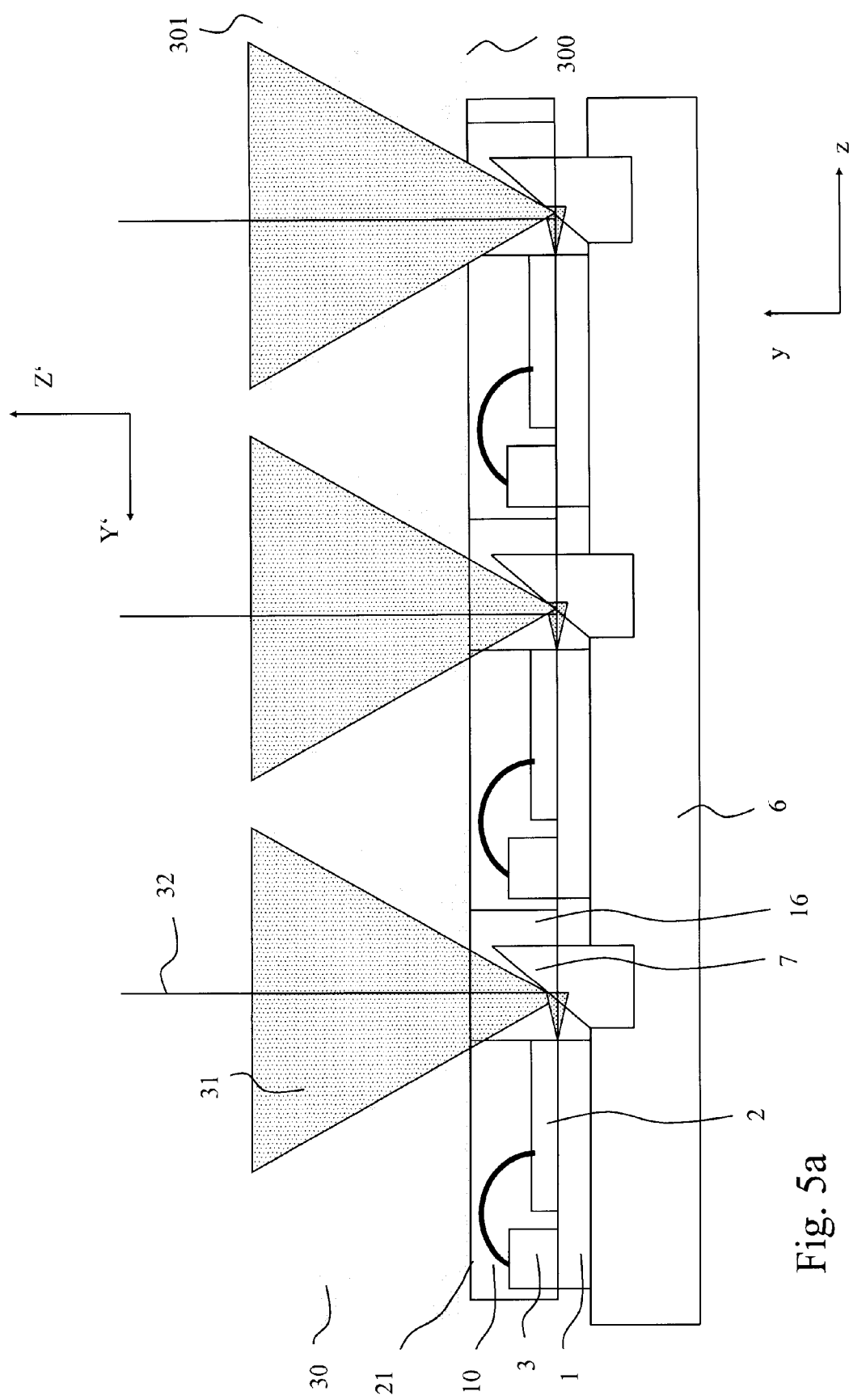
FIGS. 5a and 5b show the setup according to FIG. 4a and FIG. 4b with a transparent spacer substrate mounted on a top surface of the alignment substrate according to FIG. 2a and FIG. 2b in a side view and a top view together with output laser beams.

With reference to FIG. 1a to 6b the configuration of a high power diode laser according to a first embodiment of the present invention and the most important steps for manufacturing such a high power diode laser will be described in more detail.

As shown in FIGS. 1a and 1b, the diode laser chip 2 is mounted on the top surface of a submount 1, which is of a substantially rectangular shape having straight edges perpendicular to each other. The submount 1 can be made of any material suitable for supporting a laser diode chip and preferably has a good heat conductivity in order to spread heat generated by the diode laser chip 2 to a carrier supporting the submount 1. Furthermore, the material of the submount 1 preferably has the same coefficient of thermal expansion as the semiconductor material of the diode laser chip. Suitable materials for the submount 1 that shall not be deemed limiting the present invention are: AlN, CuWo or diamond. Typical dimensions of a submount 1 for use according to the present invention are 4 mm by 4 mm.

On the surface of the submount 1 there are provided in a conventional manner bond pads for contacting the diode laser chip 2. More specifically, a bond pad 3 for contacting the n-doped layer of the diode laser chip 2 and a bond pad 4 for contacting the p-doped layer of the diode laser chip 2 are provided. If the submount 1 is conductive, the above p-bond pad is not provided. Bonding wires 5 extend across the gap between the pad 3 and laser diode chip 2 for supplying electric power to the diode laser chip 2. As will be apparent to a person skilled in the art, both the pads 3, 4 and the diode laser chip 2 slightly protrude from the top surface of the submount 1.

As shown in FIG. 1a, the diode laser chip 2 defines a fast axis (y) perpendicular to the direction of propagation (z) of an output laser beam (not shown) and a slow axis (x) perpendicular to the fast axis. The fast axis y is perpendicular to a plane defined by the pn-junction of the diode laser chip 2. As shown in FIG. 1b, the diode laser chip 2 is mounted in a well-defined orientation on the top surface of the submount 1. More specifically, the front facet of the diode laser chip 2 is substantially flush and/or parallel with the front edge of the submount 1 and the longitudinal side surface of the diode laser chip 2 is substantially in parallel with an edge of the submount 1. As an alternative, the front facet can also protrude slightly from the front edge of submount 1 or can be disposed at a short distance, and in parallel with, the front edge of submount 1. In order to enable such an alignment of the diode laser chip 2 with regard to edges of the submount 1, stops such as those set forth below may be provided on a surface of the submount 1 so that a proper alignment of the diode laser chip 2 is obtained by abutment of one or more edges of the diode laser chip with an associated stop. Accordingly, in the embodiment according to FIG. 1b, the output laser beam (not shown) is emitted in z-direction which is substantially perpendicular to a front edge of the submount 1 and substantially in parallel with the top surface of the submount 1. As will become apparent to a person skilled in the art, the diode laser chip 2 can also be mounted in any other suitable orientation on submount 2.

FIGS. 2a and 2b show a side view and a top view of a planar alignment substrate 10 to which the above submounts are mounted and which according to the present invention is used for aligning the diode laser chips and submounts. The alignment substrate 10 generally is of rectangular shape and has a plurality of cut-outs 14-16 in accordance with the total number of laser diode submounts to be mounted. According to FIG. 2b the cut-outs 14-16 form a substantially U-shaped window, with transverse webs 13 extending between the left longitudinal web 11 and right longitudinal web 12 in order to partition the substrate 10 into portions of the same configuration. The cut-outs comprise a central cut-out 14, which extends in longitudinal direction, a left cut-out 15 and a right cut-out 16. As will be explained in the following in more detail, the right cut-out 16 serves as a window for passing the output laser beam toward the spacer substrate and collimating lens, whereas the left cut-out 15 serves for receiving the bond pads 3, 4 (cf. FIG. 1b) protruding from the top surface of the submount to be mounted and whereas the central cut-out 14 receives the laser diode chip when the submount is mounted to the alignment substrate 10. As will become apparent to a person skilled in the art a cut-out of any other suitable shape may be provided in order to enable alignment of the laser diode chips and/or submounts.

According to FIG. 2b, the central cut-out 14 is limited by a central rectangular protrusion 17 protruding from the right longitudinal web 12 of substrate 10. The top of protrusion 17 serves as an alignment stop 18 for the diode laser chip, as will be explained in more detail below. According to FIG. 2b, a small step portion 19 is provided at the right-hand side of protrusion 17 to thereby form a second alignment stop 20, perpendicular to alignment stop 18, as will be explained in more detail below. The height of step portion 19 in transverse direction is smaller than the width of the laser diode chip 2 in slow axis direction (x in FIG. 1a), e.g. corresponds to approx. 10%-30% of the total width of the laser diode chip 2 in slow axis direction. Furthermore, the thickness of the alignment substrate 10 can be substantially larger than the height of the laser diode chip in a direction perpendicular to the plane of the pn-junction. Preferably the thickness of the alignment substrate 10 is substantially larger than the height of the bond pads 3, 4 (cf. FIG. 1b) on the top surface of submount 1. Thus, it can be ensured that both the laser diode chip 2 and the bond pads 3, 4 together with the bonding wires 5 are substantially fully received by the cut-outs 14-16 formed in the alignment substrate 10, when the submounts are mounted to the alignment substrate 10.

As will become apparent to a person skilled in the art, the alignment substrate can be made of any material suitable to allow precise formation of straight alignment stops having a predetermined orientation. According to a preferred embodiment of the present invention, the alignment substrate will be made of a plane-parallel sheet of semiconductor material, in particular of mono-crystalline silicon, in which case the cut-outs and alignment stops can be formed easily and precisely using conventional etching techniques. Etching techniques are particularly suited, because they allow forming of the cut-outs and alignment stops with submicron precision. However, the invention is not limited to use of semiconductor materials as basic material for the alignment substrate. Other suitable materials not limiting the present invention are glass and ceramics. Some of these materials are suited as well for etching techniques for forming the cut-outs and/or alignment stops with high precision and orientation. As will become apparent to a person skilled in the art, the cut-outs and/or alignment stops can also be produced even at sub-micron precision using other processing techniques, such as laser cutting, micro-machining and the like.

FIGS. 3a and 3b show how according to the first embodiment of the present invention the laser diode submounts 1 are mounted to the alignment substrate 10. As shown in FIGS. 3a and 3b, the top surface of submount 1 abuts to the rear side of protrusion 17 such that the bond pads 3, 4 and the laser diode chip 1 are received in the cut-out formed in the alignment substrate 10. Due to the afore-mentioned stops the longitudinal side surface of laser diode chip 2 is substantially parallel to the alignment stop 18 on protrusion 17 or abuts the alignment stop 18 for precisely adjusting the angular orientation of the laser diode chip 2 with respect to substrate 10 in slow axis direction (x; cf. FIG. 1a). Furthermore, according to FIG. 3b, the edge emitting facet of laser diode chip 2 is substantially in parallel with the alignment stop of step portion 19 used for precisely adjusting both the longitudinal position of laser diode chip 2 with respect to substrate 10 and the angular orientation of the laser diode chip 2 with respect to substrate 10 (y-direction; cf. FIG. 3a). It is noted that the submount 1 can also contact the left longitudinal web. As shown in FIG. 3b, a portion of the left edge of submount 1 does not contact the left longitudinal web 11 of substrate 10 so as to prevent build-up of tensions in submount 1. As shown in FIG. 3a, the bond pads 3, the laser diode chips 2 and the bonding wires 5 are fully received by the cut-outs formed in substrate 10 when the submounts 1 are mounted to substrate 10. According to another embodiment the laser diode chips are aligned to the submounts as described above. Alignment features provided on the submount and/or on the planar spacer substrate and/or planar alignment substrate enable a corresponding precise alignment as will become apparent to a person skilled in the art.

According to a preferred embodiment the laser diode submounts are mounted to the alignment substrate in the following manner. Firstly, the laser submounts 1 are positioned with respect to substrate 10 as schematically shown in FIG. 3b. At this stage, the bond pads 3, 4 and the laser diode chip 2 are not necessarily mounted on the top surface of submount 1. If so, it is preferred that the laser diode chip is not yet firmly connected with the top surface of submount 1 so that its position and angular orientation with respect to submount 1 can still be varied. As a next step, the submounts 1 are fixedly connected with substrate 10, preferably using bonding techniques, such as fusion bonding, hard soldering or laser welding. As a next step, the laser diode chips 2 are positioned on the submounts 1 such that the longitudinal side edge thereof is in parallel with the stop 18 on top of protrusion 17 and that the front facets are in parallel with the stop provided by the step portion 19 to thereby align the laser diode chip 2 in fast axis and slow axis direction. As a next step the laser diode chip 2 is bonded onto the top surface of submount 1 using well-known soldering techniques. The conditions during soldering are such that the orientation and alignment of the laser diode chip 2, as determined by abutment to the stops as outlined above, remains substantially unchanged.

As will become apparent to a person skilled in the art, as an alternative at least one of the above stops may alternatively be disposed directly on the top surface of the submount, for properly aligning the diode laser chip with respect to the edges of the submount. According to that alternative embodiment, the same or other stops on the top side surface of the submount interact with the edges of the cut-outs of alignment substrate that must then be properly and differently located as compared to FIG. 3a and FIG. 3b in order to properly align the submount with respect to the alignment substrate. According to such an alternative, the laser diode chip may be soldered to the submounts before bonding the submounts to the alignment substrate 1.

As shown in FIGS. 4a and 4b, as a next step the submounts 1 are bonded to a heatsink 6. In operation, the submounts 1 serve to rapidly spread heat generated by the laser diode chips 2 whereas the heatsink 6 serves to further dissipate the heat to the environment. The heatsink 6 is made of a material having a good thermal conductivity and at the same time a similar coefficient of thermal expansion than the submounts 1. Suitable heatsink materials are e.g. copper, ceramic materials or diamond. According to the present invention, the submounts 1 are preferably bonded to the heatsink 6 using techniques such as soldering or laser welding. As shown in FIG. 4a, reflective mirrors 7 are disposed on the upper surface of the heatsink 6 for deflecting the output laser beams by an angle of ninety degrees. The mirrors 7 are slanted by 45 degrees with respect the upper surface of heatsink 6. Such slanted portions can be manufactured e.g. by micro-machining the surface of heatsink 6 and may be coated by a reflective coating. Preferably, the mirrors 7 are plane mirrors. However, according to alternative embodiments, the mirrors 7 can also have a surface profile for shaping the beam profile of the output laser beams, e.g. the mirrors 7 may be formed as concave or convex hollow mirrors.

Figure 5B:
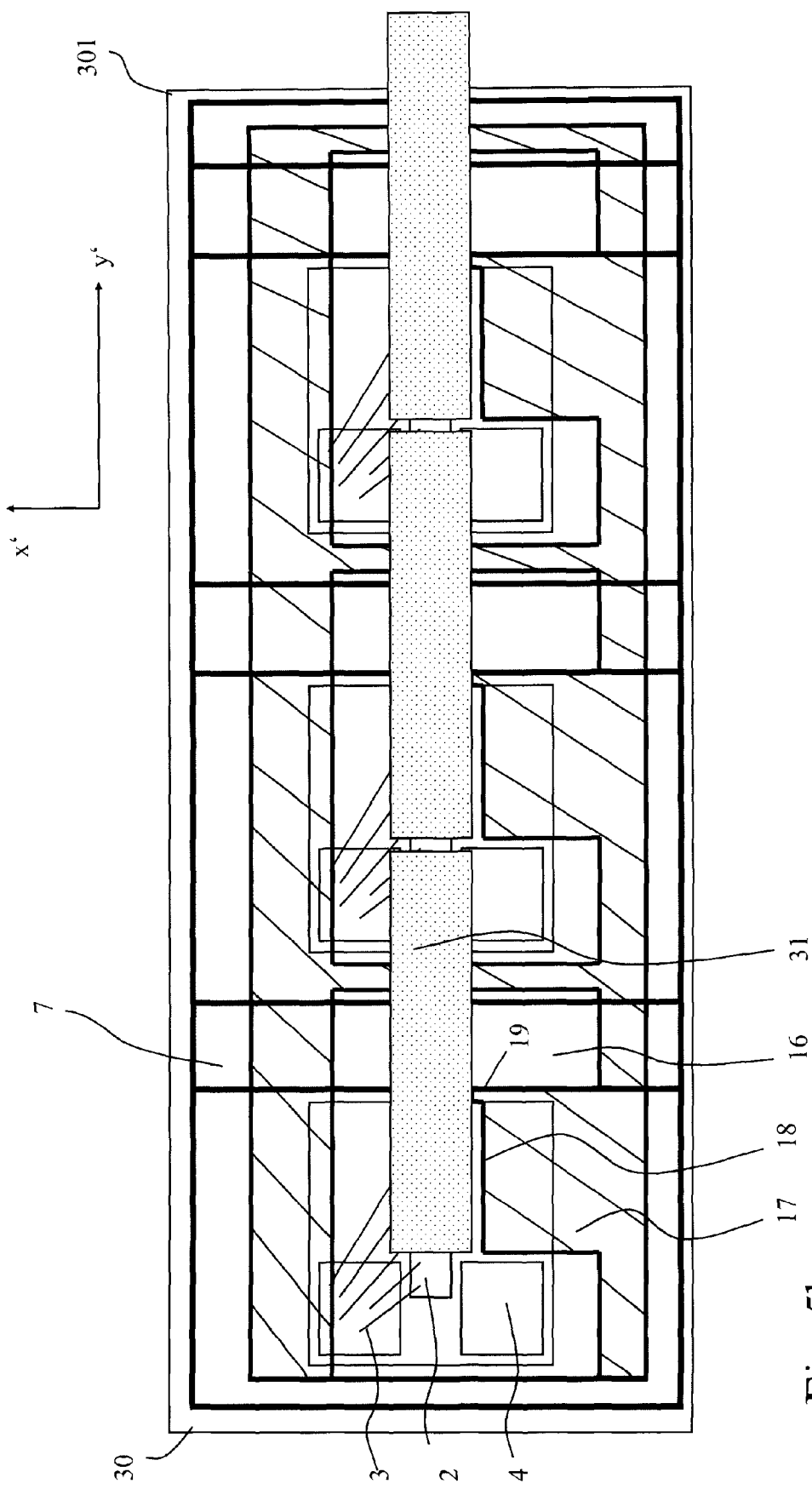

As shown in FIG. 5a, in operation the output laser beams 31 are deflected by the mirrors 7 from a direction of propagation z by 90 degrees to a direction of propagation z' to thereby pass the right cut-out portions 16 of alignment substrate 10. As shown in FIG. 5a, on top of the alignment substrate 10 there is provided a spacer plate 30, which is of a transparent material such as glass and is a plate having two surfaces 300, 301 that are parallel to each other. Although not explicitly shown in the schematic drawing according to FIG. 5a, the thickness of the spacer plate 30 in the direction of propagation z' is substantially larger than the lateral dimensions of the laser diode chips 2. According to the present invention, the thickness of the spacer plate 30 is of the order millimeters, a suitable thickness lying in the range between 1 mm and 5 mm and more preferably in the range between 2 mm and 4 mm. Thus, the light cones in the fast axis direction y, y' of the output laser beams 31 have opened substantially when reaching the upper surface of the spacer plate 30. FIG. 5b is a top view onto the embodiment according to FIG. 5a.

The spacer plate 30 serves (a) to precisely adjust the distance between the light emitting facets of the laser diode chips and downstream light collimating lenses and (b) to precisely adjust the orientation of downstream light collimating lenses. Plane-parallel or planar transparent substrates of good optical quality, which are necessary for this purpose, are readily available at low prices. As the spacer substrate 30 abuts to the abutment surfaces 21 of alignment substrate 10, the orientation of the spacer substrate 30 substantially corresponds to that of alignment substrate 10. Furthermore, as the alignment substrate 10 is a planar or plane-parallel plate, the top surface of spacer substrate 30 automatically is parallel to the top surface of the submounts 1 with the laser diode chips 2 mounted thereon. Thus, by simply putting plano-convex collimating lenses on the top surface of spacer substrate 30, as shown in FIG. 6a, it can be ensured that the optical axes of the fast axis collimating lenses 33 are in parallel with the optical axes defined by the output laser beams 31, i.e. with the direction of beam propagation of the respective output laser beams 31.

As will become apparent to a person skilled in the art, a mirror similar to that described with reference to FIG. 5a above can be provided directly on the top surface of a submount or heat sink on which the laser diode chips are mounted. Such a mirror can be configured to shape the beam profile of the output laser beams, as described above with reference to FIG. 5a.

Figure 6A:
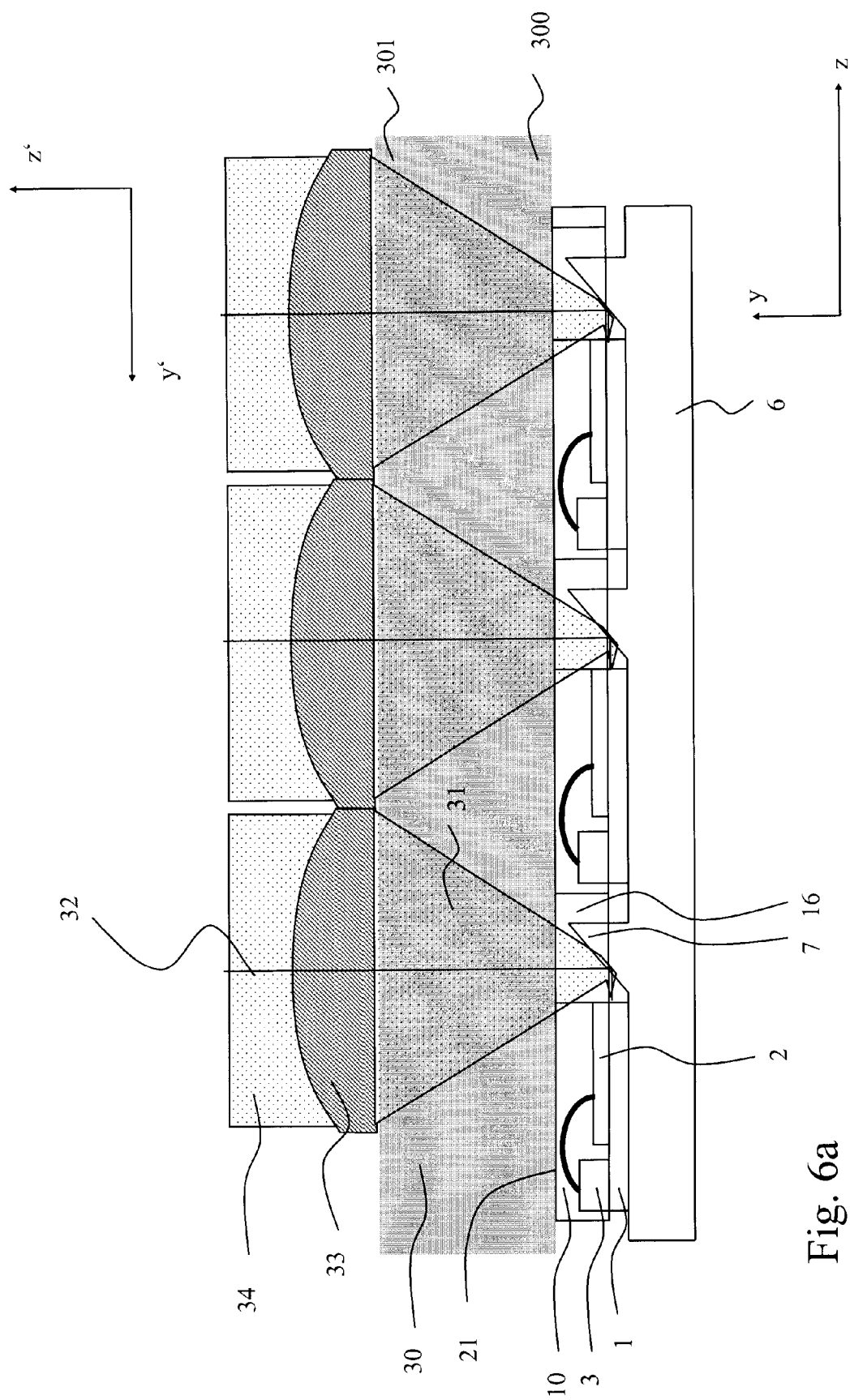
FIGS. 6a and 6b show the setup according to FIGS. 5a and 5b with fast axis collimating lenses mounted on the top surface of the spacer substrate in a side view and a top view together with output laser beams.

As shown in FIG. 6a, the plane rear sides of the collimating lenses 33 directly abut to the top surface 301 of spacer substrate 30. The collimating lenses 33 are made e.g. by pressforming or micro-machining a transparent glass substrate or resin or any other suitable method. The collimating lenses 33 are bonded onto the top surface 301 of spacer substrate 30, e.g. using fusion bonding, soldering or laser welding. Preferably, according to the present invention gluing techniques for bonding two substrates are avoided at all steps of mounting the diode laser assembly according to the present invention. As will become apparent to a person skilled in the art, the above spacer substrate 30 can also be omitted by integrating the alignment substrate and spacer substrate into a single planar substrate.

As shown in FIG. 6a, the laser diode chips 2 are disposed at equidistant spacings determined by the stops 20 (cf. FIG. 2b). Accordingly, for an optimum collimation of the output laser beams 31, it is necessary to properly align the collimating lenses 33 with the output laser beams 31. For this purpose, the invention preferably makes use of lens arrays, i.e. of a regular arrangement of the collimating lenses at equidistant spacings identical to the spacings between two adjacent stops 20 (cf. FIG. 2b). Such lens arrays can be manufactured easily at moderate costs. Thus, in order to ensure an optimum imaging quality, it is only necessary to adjust (a) the lateral position of the lens array in the plane of surface 301 of spacer substrate 30 by laterally shifting the lens array with respect to the spacer substrate 30 and (b) the angular orientation of the lens array by rotating the lens array with respect to the spacer substrate 30 about a central axis of rotation which is in parallel with the direction of beam propagation z', i.e. perpendicular to the top surface 301 of spacer substrate 30. Once a proper orientation and alignment of the lens array has been found, this orientation and alignment is fixed by bonding the lens array to the spacer substrate 30.

More specifically, according to FIG. 6a all laser diode chips are aligned to each other such that the optical axes of the laser diode chips are parallel to each other and in a plane defined by the slow axis and axis of propagation of the output laser beams.

Figure 6B:
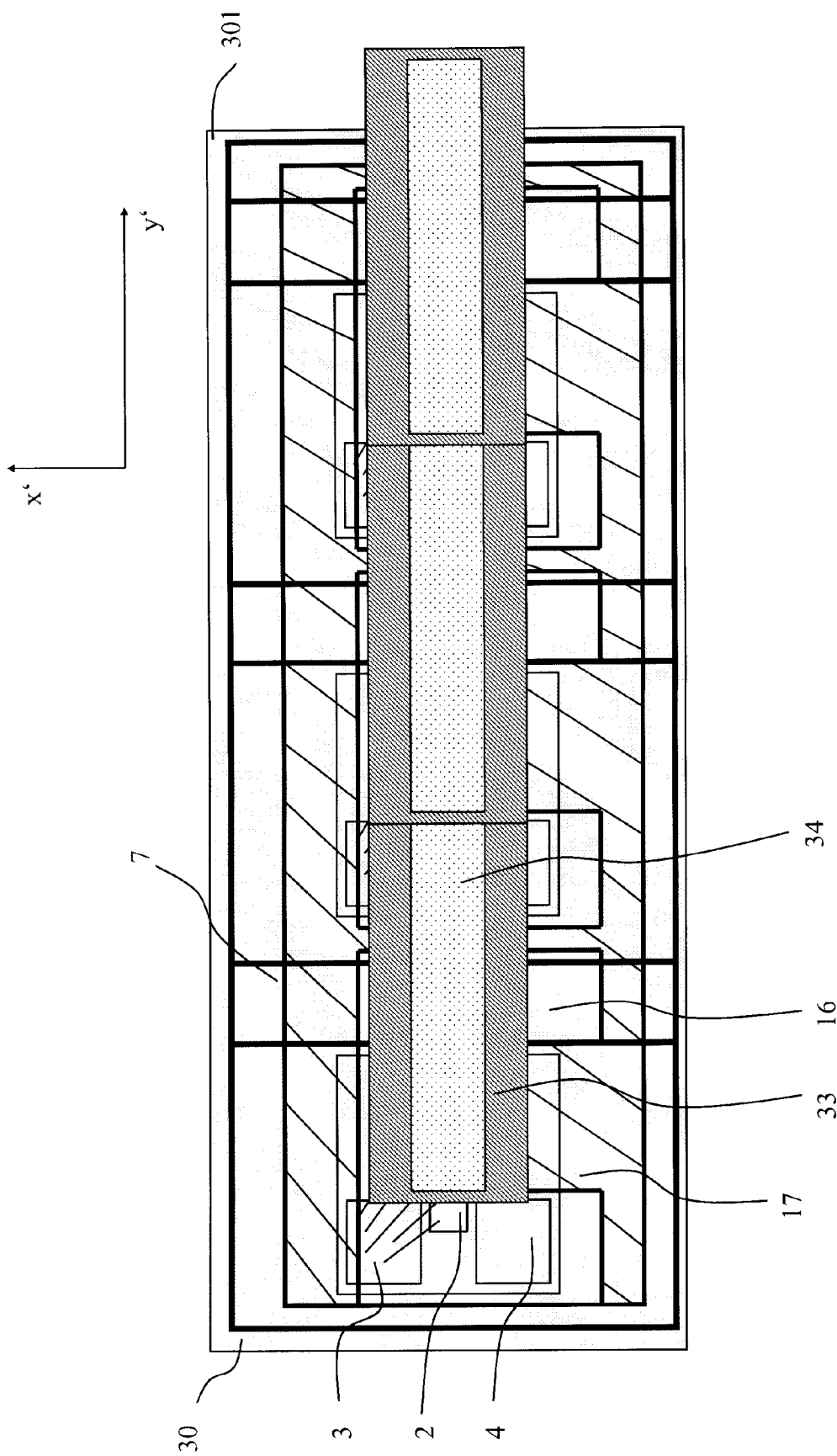

FIG. 6b shows the embodiment of FIG. 6a in a top view. Clearly, the dimension in the fast axis direction y' is much larger as than in slow axis direction x' due to the different divergences of the output laser beams in both directions. As can be seen in FIG. 6b, the light cones of the output laser beams 34 in the fast axis direction y' almost intersect each other when entering the lens array 33. In other words: the fill rate of the collimated output laser beams 34 in the fast axis direction y' when exiting the lens array 33 is almost 100%. This fill rate is substantially given by the thickness of the spacer substrate 30 in the direction of beam propagation.

Figure 7A:
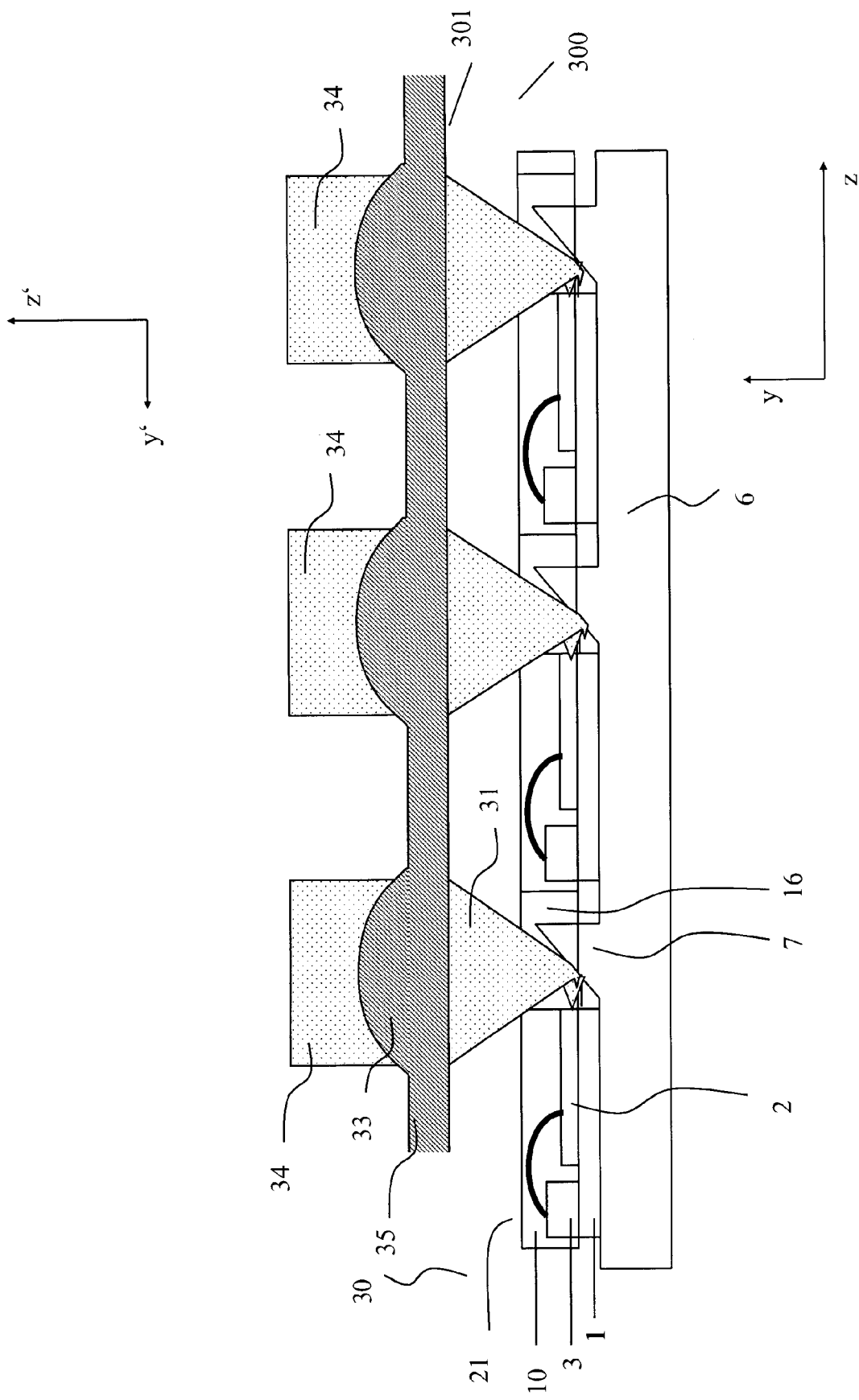
FIGS. 7a and 7b show a modification of the embodiment according to FIG. 6a and FIG. 6b in a side view and a top view, wherein a fill rate of the output laser beams in the fast axis direction is reduced.
Figure 7B:
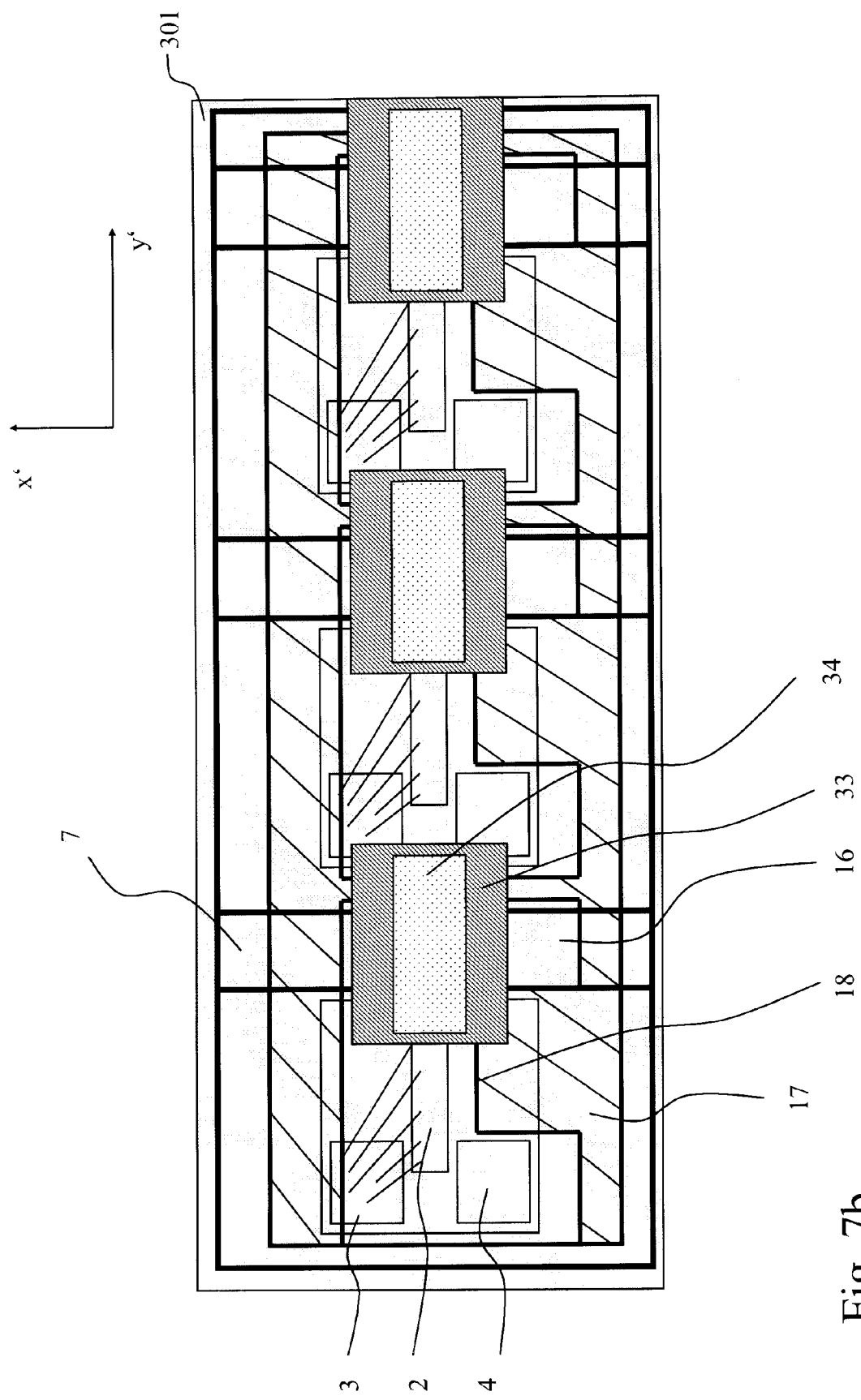

As a high fill rate might cause problems with beam adjustment, according to a modification as shown in FIGS. 7a and 7b, the fill rate is adjusted to approx. 50% or 33% by using a suitable thickness of the spacer substrate 30.

Figure 8:
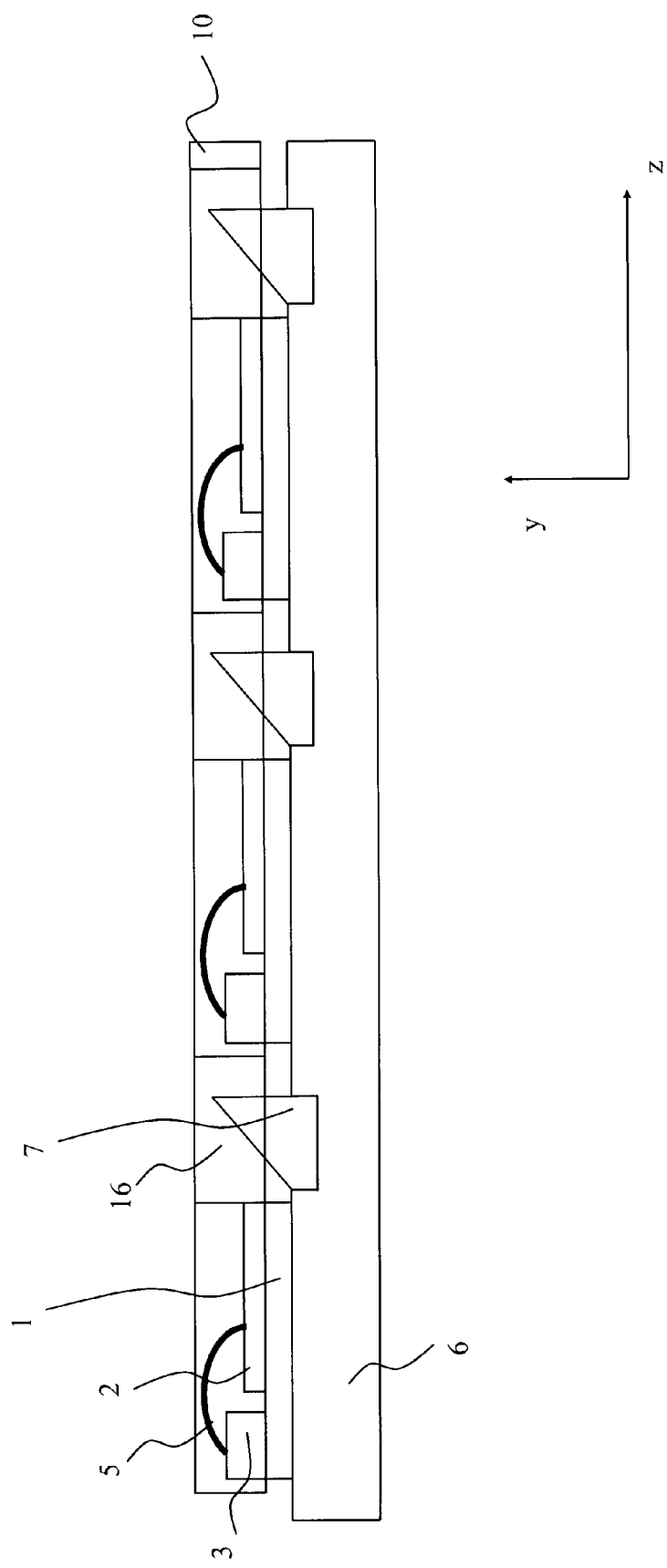
FIG. 8 shows a further modification of the embodiment according to FIG. 4a in a schematic side view.

FIG. 8 shows a further modification of the first embodiment. Referring to FIG. 8, the mirrors 7 are not unitarily provided with the heatsink 6 but instead inserted into grooves on the upper surface of heatsink 6 later. Thus, the mirrors can be manufactured very precisely as separate members and/or can be manufactured with different surface profiles, e.g. as hollow mirrors for further beam shaping.

Figure 9:
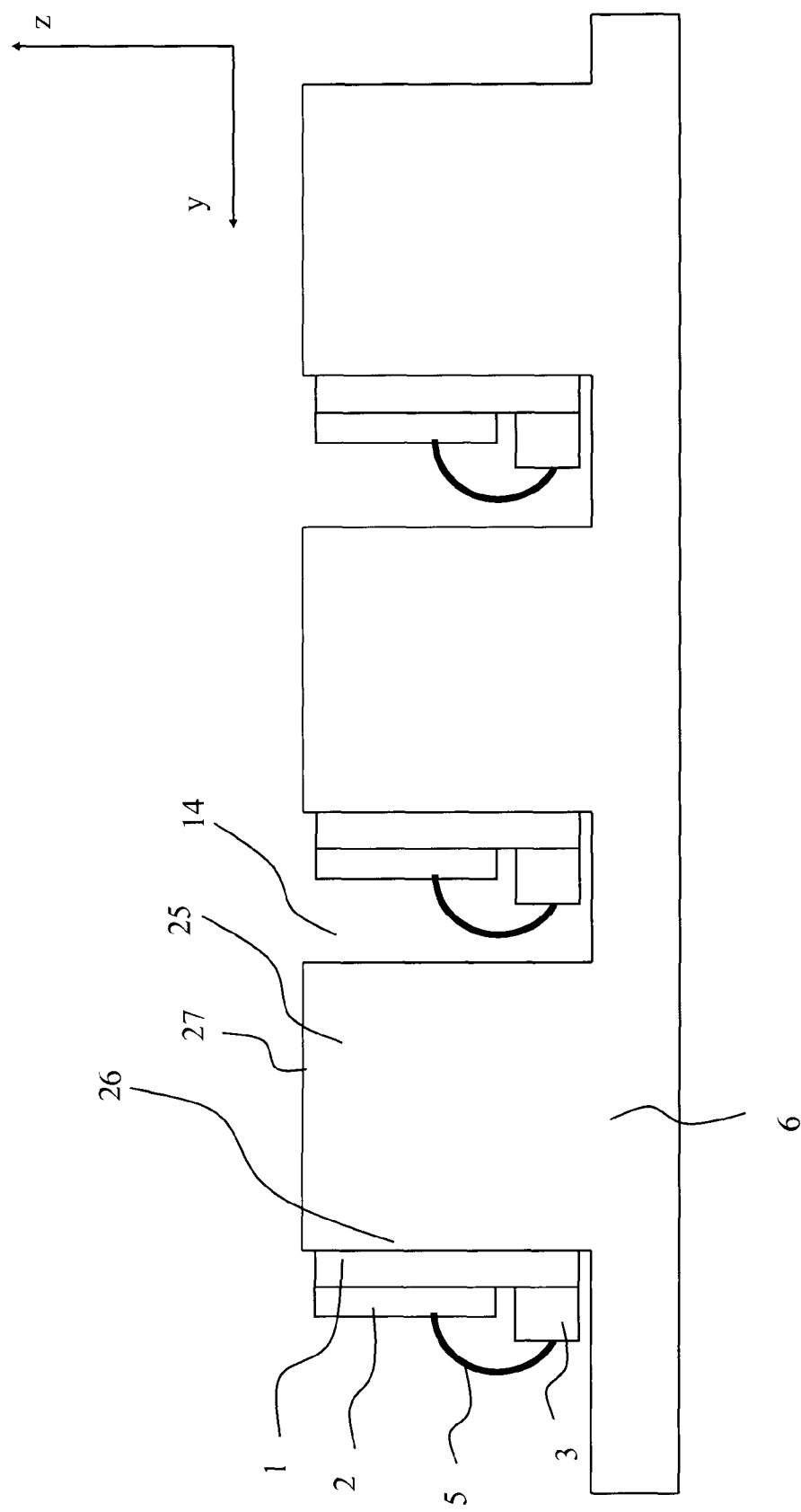
FIG. 9 shows the mounting of plural laser diode submounts on upright side surface of a heatsink according to a second embodiment of the present invention.
Figure 10:
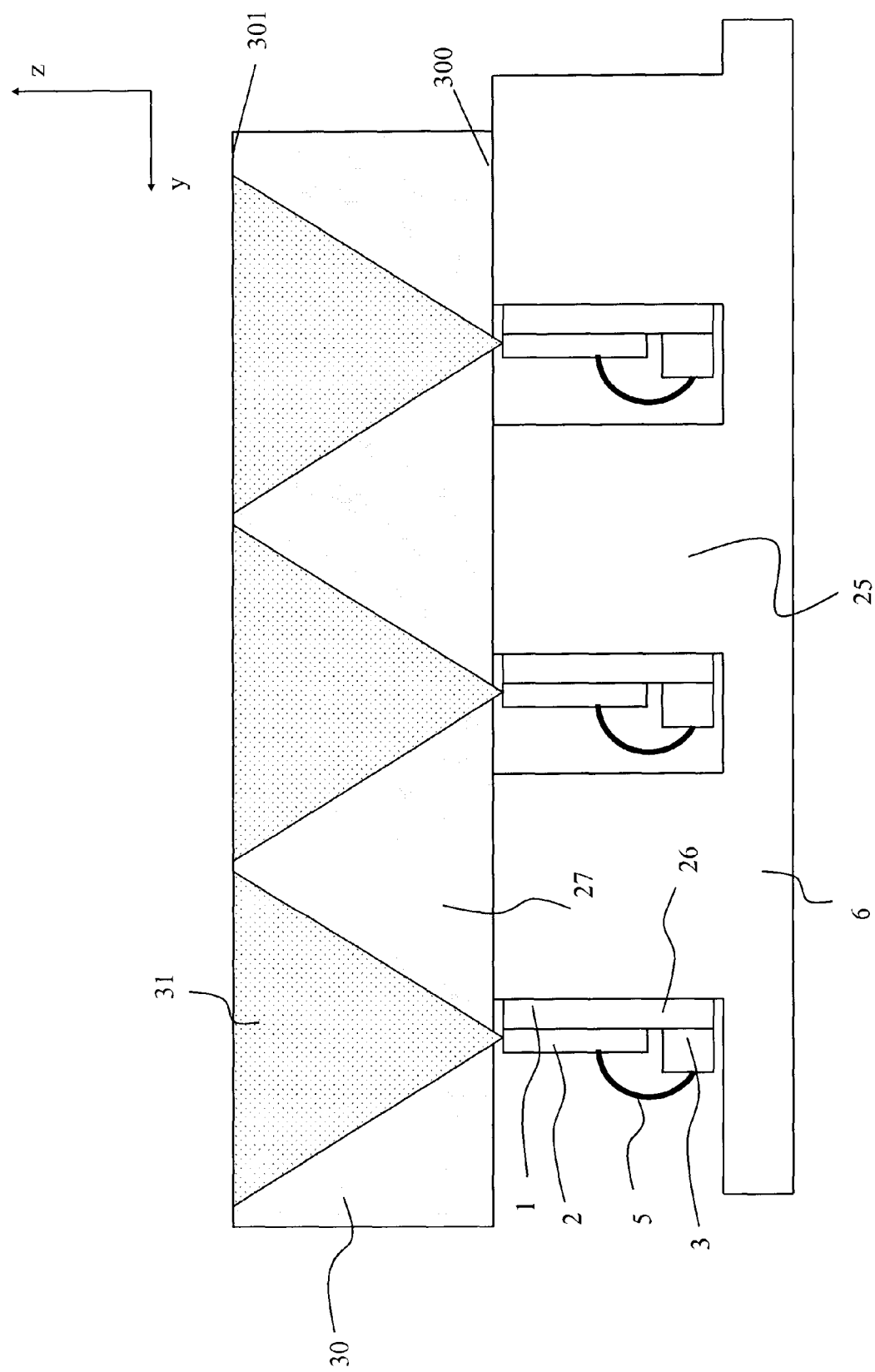
FIG. 10 shows the embodiment according to FIG. 9 with a transparent spacer substrate mounted on alignment surfaces provided on the heat sink in a schematic side view together with output laser beams.

Referring to FIG. 9 and FIG. 10, a second embodiment according to the present invention will be described. As shown in FIG. 9, the heat sink 6 itself is provided with a plurality of rectangular protrusions 25 that are disposed at equidistant spacings in the fast axis direction y. Such heatsinks can be manufactured precisely, e.g. using micro-machining. While the side surfaces 26 of the protrusions 25 form alignment stops for aligning the submounts 1, the upper surfaces 27 serve as abutment surfaces for aligning the spacer substrate 30 in parallel with the bottom of heatsink 6, i.e. perpendicular to the direction of beam propagation (z) of the output laser beams 31. For properly adjusting the position of the submounts 1 in the direction of beam propagation (z) and in the slow axis direction, i.e. perpendicular to the line of drawing of FIG. 9, additional stops (not shown) can be formed on the side surface 26 and/or on the bottom of submount 1. After bonding the submounts 1 to the side surfaces 26, the stops and side surfaces 26 define the orientation of the direction of beam propagation (z) and of the fast and slow axis.

Figure 11:
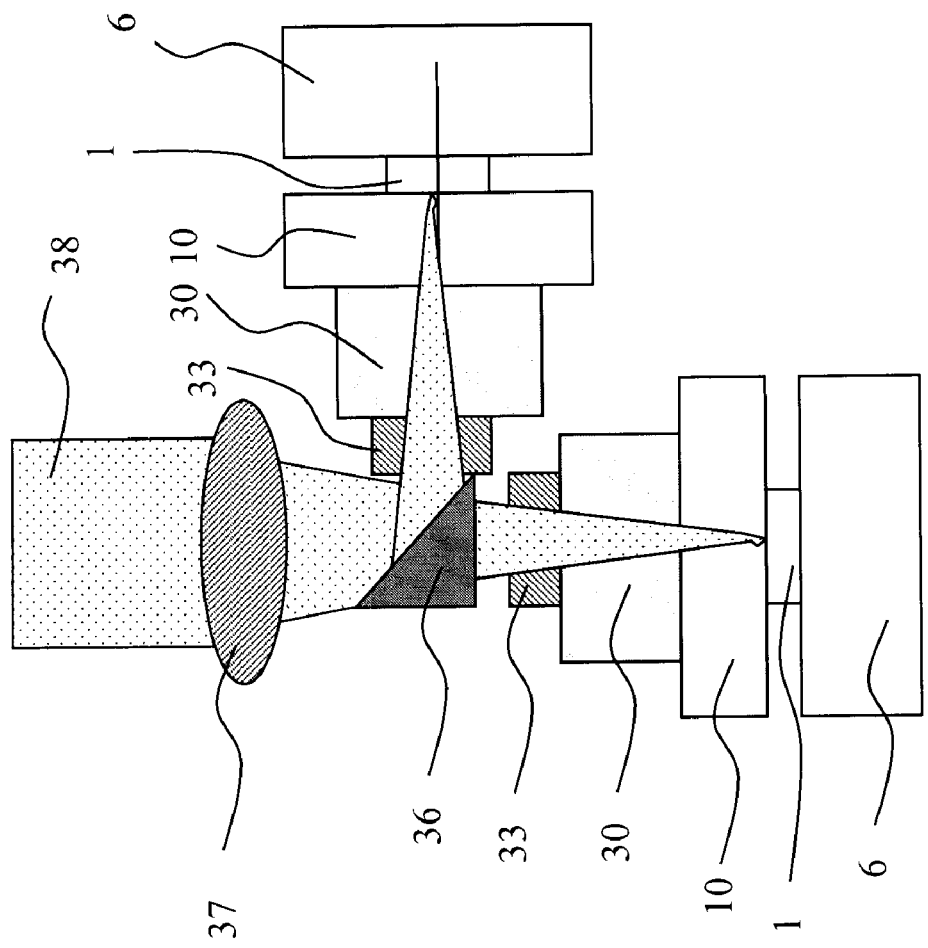
FIG. 11 shows the superposition of two laser beams output by two single laser diodes according to the first embodiment of the present invention.

FIG. 11 shows a setup for superposing two fast axis collimated output laser beams and for subsequent slow axis collimation according to the present invention. The setup comprises two rows each with at least one single laser diode submount 1, each having a single diode laser chip mounted thereon. In the manner as described in detail with reference to FIG. 1-6 above, the submounts 1 are interposed between a heatsink 6 and the alignment substrate 10. A spacer substrate 30 is bonded onto the top surface of alignment substrate 10. A collimating lens 33 for fast axis collimation is bonded onto the top surface of spacer substrate 30. Two modules of the above configuration are arranged perpendicular to each other. While the output laser beam of the module on the left-hand side passes the beam superposition prism 36 substantially unaffected, the output laser beam of the module on the right-hand side is reflected by the slanted surface of prism 36 such that the two output laser beams are superposed with collinear optical axes. Downstream of prism 36 there is provided another collimating lens 37 for slow axis collimation to generate a fast and slow axis collimated output laser beam 38. Thus, two rows of laser diode emitters are interleaved and the output laser beams superposed. For this purpose, a fill rate of approx. 50% is most preferably as it will allow an output laser beam in the shape of a long line. If the above fill rate is less than 50% a plurality of laser beams are output at equidistant spacings and in parallel with each other. As will become apparent to a person skilled in the art, also more than two rows, e.g. three rows, can be interleaved in the above manner to provide an output laser beam in the shape of a long line.

As will become apparent to a person skilled in the art, the submounts can also be stacked in a different manner in order to obtain output laser beams of a different geometry, e.g. of a circular or elliptical shape, square or rectangular shape, of a star-like shape etc.

When used for fibre coupling or similar applications, the total number of submounts stacked in fast axis direction is typically determined by the beam quality in slow axis in order to make the beam quality in fast axis and slow axis substantially identical. As an example, with an $M^2$ value of 14 in slow axis and an $M^2$ value of 1 in fast axis stacking of a total of fourteen submounts in fast axis direction would be suitable in order to make the beam quality in fast axis and slow axis substantially identical.

As will become apparent to a person skilled in the art having access to the disclosure of this application the arrangement according to FIG. 11 can be extended to include additional laser diode chips. In another embodiment (not shown) the laser diodes chips are each mounted on a heat sink or submount in the manner as described above with reference to FIG. 11 to form individual laser light emitters that can comprise a plurality of laser diode chips. These laser light emitters can be disposed, on a single common carrier, at different levels in fast axis direction. As an example, a plurality of such laser light emitters, such as 5 or 6 laser light emitters, can be disposed along a half-circle at equiangular distances on the common carrier. The output laser beams of the laser light emitters aim at a central beam deflecting means, such as mirrors or prisms used to deflect the output laser beams in slow axis direction and in parallel with each other, similar to the arrangement shown in FIG. 11. The difference in height of the laser light emitters is substantially given the divergence in fast axis direction and the distance between the front facet of the laser light emitters and the central beam deflecting means, taking into account the fast axis collimation caused by the associated collimating lenses. After deflection in slow axis direction the output laser beams are symmetrized, i.e. have a substantially symmetric beam profile, and can be imaged with a fill factor of substantially 100%, or if desired less than 100%, onto an optical fibre. Such an optical fibre can be part of a fibre laser or fibre laser amplifier. Thus, this arrangement can be used for efficient optical pumping of a fibre laser or of a fibre laser amplifier.

As will become apparent to a person skilled in the art, the high power diode laser according to the present invention can be applied in fibre coupling, wavelength and polarization multiplexing and any other related application.

Thus, the present invention is also directed to a method for manufacturing a high power laser diode which comprises a plurality of laser light emitters 2 and a plurality of light collimating means 33, providing a planar substrate means 10, 30 for precisely defining a distance between a respective laser light emitter 2 and an associated light collimating means and for supporting said collimating means 33, said planar substrate means 10, 30 being configured for aligning said plurality of laser light emitters 2 to each other such that the optical axis of said laser light emitters are parallel to each other and for defining a predetermined distance in fast axis direction between said laser light emitters.

Referring to the drawings, such a method may further comprise the steps of:

providing said planar substrate means including a substrate 10 which is transparent to said output laser beams 31 or is provided with cut-outs for said output laser beams 31; and bonding said collimating means 33 with said planar substrate means 30 and said planar substrate means 30 with said substrate 10 using one of: bonding, soldering and laser welding.

In such a method each of said laser light emitters 2 may be mounted on a submount 1 and said submounts 1 may be mounted on a single carrier 10; 6 at predetermined spacings and aligned in fast axis direction, said method further comprising the step of providing stops 18, 20, 26 configured such that said submounts 1 are aligned in least one of fast axis direction y and slow axis direction and with the optical axis being parallel to the substrate 10.

Such a method may further comprise the step of shifting said collimating means 33 relative to said submounts 1 along a surface of said planar substrate means 10, 30 in fast axis direction y before performing said step of bonding.

Such a method may further comprise the step of rotating said collimating means 33 relative to said submounts 1 in a plane spanned by said planar substrate means 30 before performing said step of bonding.

In such a method at least one of said stops may be formed on a surface of said submount 1 for precisely aligning said laser light emitters 2 with edges of said submount.

In such a method at least one of said stops may be formed on said carrier 10; 6 to which said submounts 1 are mounted.

In such a method said substrate 10 may be provided with cut-outs 14-16 using an etching process, micro-maching or laser cutting, wherein said submounts 1 are mounted on at least one heatsink 6 and wherein said substrate 10 is supported by said submounts 1 and such that said laser light emitters 2 are at least partly received by said cut-outs 14-16 and aligned by at least one stop 18, 20 forming a respective edge of said cut-outs.

Such a method may further comprise the step of providing beam deflecting means 7 on a surface of said heatsink 6, preferably using micro-machining, for deflecting a respective output laser beam 31 toward said collimating means 33.

In such a method said beam deflecting means 7 may be formed with a reflective surface, which is shaped such that said output laser beams 31 are beam-shaped while being deflected toward said collimating means 7.

In such a method the thickness of said planar substrate means 10, 30 may be selected such as to set a fill rate of said output laser beams 31 on a surface of said light collimating means 33 in fast axis direction y, y' to less than 100%, more preferably to less than 90%, most preferably to 50% or 33%, such that said collimating means 33 are substantially larger than said output laser beams to be collimated.

LIST OF REFERENCE NUMERALS

1 submount
2 diode laser chip
3 bond pad for n-contact
4 bond pad for p-contact
5 electric wires for n-contact
6 heatsink
7 mirror
10 alignment substrate
11 left longitudinal web
12 right longitudinal web
13 transverse web
14 central cut-out portion
15 left cut-out portion
16 right cut-out portion
17 first step portion
18 alignment stop (slow axis)
19 second step portion
20 alignment stop (fast axis)
21 abutment surface
25 mounting protrusions
15 mounting and alignment surface
27 abutment surface
30 transparent spacer
300 first surface
301 second surface
31 uncollimated light beam
32 optical axis
33 collimating lens (fast axis)
34 fast axis collimated light beam
35 lens array
36 beam superposing means
37 collimating lens (slow axis)
38 collimated light beam

What is claimed is:

1. A high power laser diode comprising a plurality of laser light emitters, a plurality of light collimating means and a planar substrate means,
   each of said laser light emitters defining, in a direction perpendicular to a direction of propagation of an output laser beam, a fast axis y and a slow axis x, and
   each of said light collimating means being associated with a laser light emitter and configured for collimating said output laser beam at least in a fast axis direction y, wherein
   said planar substrate means comprises a planar alignment substrate and a planar spacer plate disposed on top of said planar alignment substrate and having a first surface and a second surface opposite to and in parallel with said first surface,
   said planar alignment substrate comprises a plurality of cut-outs, and
   at least one stop formed by a respective edge of said cut-outs,
   by abutment of a respective laser light emitter or of a respective submount used for mounting a laser light emitter to said at least one stop said planar alignment substrate aligns said plurality of laser light emitters to each other such that the optical axes of said laser light emitters are parallel to each other and a predetermined distance is defined between said laser light emitters, and
   said first surface and said second surface of said planar spacer plate extend perpendicular to said direction of propagation, said first surface abuts to a planar spacer alignment surface of said planar alignment substrate, which is perpendicular to said direction of propagation, and said second surface abuts to a plane rear side of said collimating means so that a thickness of said planar spacer plate precisely defines a distance between a respective laser light emitter and an associated light collimating means.

2. The high power laser diode as claimed by claim 1, wherein said first surface and said planar spacer alignment surface as well as said second surface and said plane rear side of said collimating means are bonded to each other using one of: fusion bonding, soldering and laser welding.

3. The high power laser diode as claimed by claim 1, wherein each of said laser light emitters is mounted on a submount, said submounts being mounted on a single carrier at predetermined spacings in fast axis direction y, said stops aligning said submounts in at least one of fast axis y and slow axis x direction and parallel to the surface of the single carrier resulting in parallel emission of each laser light emitter.

4. The high power laser diode as claimed by claim 3, further comprising at least one stop disposed on a surface of said submounts for precisely aligning said laser light emitters with edges of said submounts.

5. The high power laser diode as claimed by claim 3, wherein said single carrier is formed by said planar alignment substrate.

6. The high power laser diode as claimed by claim 3, wherein said single carrier is a heatsink having a plurality of upright mounting protrusions and cut-outs being disposed on a base in an alternating manner and at predetermined spacings.

7. The high power laser diode as claimed by claim 3, wherein said cut-outs of said planar alignment substrate are provided by an etching process, micro machining or laser cutting, wherein said submounts are mounted on at least one heatsink and wherein said planar alignment substrate is supported by said submounts such that said laser light emitters are at least partly received by said cut-outs.

8. The high power laser diode as claimed by claim 7, said heatsink further comprising beam deflecting means for deflecting a respective output laser beam toward said collimating means.

9. The high power laser diode as claimed by claim 8, wherein said beam deflecting means comprises a reflective surface, which is shaped such that said output laser beams are shaped while being deflected toward said collimating means.

10. The high power laser diode as claimed by claim 3, wherein each of said laser light emitters is mounted on a submount or heat sink, said submounts or heat sinks being disposed at different levels on a common carrier.

11. The high power laser diode as claimed by claim 10, said submounts or heat sinks being disposed along a half-circle at equiangular distances on said common carrier, central beam deflecting means being disposed at a centre of said half-circle for deflecting said output laser beams in slow axis direction.

12. The high power laser diode as claimed by claim 3, said submounts or heat sinks each further comprising a beam deflecting means for deflecting an output laser beam toward said collimating means.

13. The high power laser diode as claimed by claim 12, wherein said beam deflecting means comprise a reflective surface, which is shaped such that said output laser beams are shaped while being deflected toward said collimating means.

14. The high power laser diode as claimed by claim 1, wherein said plurality of cut-outs are configured for at least one of passing said output laser beams and receiving electrical connection means of said laser light emitters.

15. The high power laser diode as claimed by claim 1, wherein a thickness of said planar substrate means along said direction of light propagation is such that a fill rate of said output laser beams on a surface of said light collimating means in fast axis direction is less than 100%, more preferably less than 90%, most preferably 50% or 33%, such that said collimating means are substantially larger than said output laser beams to be collimated.

16. The high power laser diode as claimed by claim 1, wherein each of said laser light emitters is mounted on a submount, said planar alignment substrate being configured for stacking n submounts in fast axis direction, with the number n of submounts determined to equal a beam parameter product in fast axis direction and slow axis direction after stacking.

17. The high power laser diode as claimed by claim 1, wherein each of said laser light emitters is mounted on a submount, said planar alignment substrate being configured for aligning said submounts along at least two rows in an interleaved manner such that said output laser beams are collimated to an output laser beam of a predetermined geometric shape with 100% optical fill factor.

18. The high power laser diode as claimed by claim 1, wherein each of said laser light emitters is a diode laser bar each comprising a plurality of laser light emitters.

19. The high power laser diode as claimed by claim 1, further comprising downstream refractive optical means configured to symmetrize at least one of divergence and geometry in fast axis direction and slow axis direction.

20. A method for manufacturing a high power laser diode, which comprises a plurality of laser light emitters and a plurality of light collimating means, comprising the steps of:
providing a planar alignment substrate having a plurality of cut-outs and at least one stop formed by a respective edge of said cut-outs; and
mounting said laser light emitters on top surfaces of submounts;
mounting said submounts to said planar alignment substrate and such that by abutment of a respective laser light emitter or of a respective submount to said at least one stop said planar alignment substrate aligns said plurality of laser light emitters to each other such that the optical axes of said laser light emitters are parallel to each other and a predetermined distance in fast axis direction is defined between said laser light emitters;
providing a planar spacer plate having a first surface and a second surface opposite to and in parallel with said first surface; and
disposing said planar spacer plate on top of said planar alignment substrate such that said first surface and said second surface of said planar spacer plate extend perpendicular to a direction of propagation of an output laser beam, said first surface abuts to a planar spacer alignment surface of said spacer alignment substrate, which is perpendicular to said direction of propagation, and said second surface abuts to a plane rear side of said collimating means such that a thickness of said planar spacer plate precisely defines a distance between a respective laser light emitter and an associated light collimating means.

21. The method as claimed by claim 20, further comprising the steps of:
bonding said plane rear side of said collimating means with said planar spacer plate and said planar spacer plate with said planar alignment substrate using one of: bonding, soldering and laser welding.

22. A high power laser diode comprising a plurality of laser light emitters, a plurality of light collimating means and a planar substrate,
each of said laser light emitters defining, in a direction perpendicular to a direction of propagation of an output laser beam, a fast axis and a slow axis, and
each of said light collimating means being associated with a laser light emitter and configured for collimating said output laser beam at least in a fast axis direction y,
said planar substrate means extending perpendicular to said direction of propagation and comprising a plurality of first mounting surfaces and a plurality of second mounting surfaces opposite to and in parallel with said first mounting surfaces, said first mounting surfaces and said second mounting surfaces extending in parallel with said direction of propagation, wherein
said planar substrate means comprises a planar alignment substrate and a planar spacer plate disposed on top of said planar alignment substrate and having a first surface and a second surface opposite to and in parallel with said first surface,
said laser light emitters or carriers supporting said laser light emitters are mounted to said first mounting surfaces, which are provided on said planar alignment substrate; and
said output laser beams pass said planar spacer plate,
said planar spacer plate being transparent to or providing cut-outs for said output laser beams; and
said first surface and said second surface of said planar spacer plate extend perpendicular to said direction of propagation, said first surface abuts to a planar spacer alignment surface of said planar alignment substrate, which is perpendicular to said direction of propagation, and said second surface abuts to a plane rear side of said collimating means so that a thickness of said planar spacer plate precisely defines a distance between a respective laser light emitter and an associated light collimating means.

23. The high power laser diode as claimed by claim 22, wherein said laser light emitters or said carriers supporting said laser light emitters are mounted to said first mounting surfaces of said planar alignment substrate using one of: fusion bonding, soldering and laser welding;
said light collimating means being mounted to said second mounting surface of said planar spacer plate using one of: fusion bonding, soldering and laser welding.

24. The high power laser diode as claimed by claim 23, wherein each of said laser light emitters is mounted on a submount, said submounts being mounted on said first mounting surfaces of said planar alignment substrate at predetermined spacings in fast axis direction, wherein stops are provided for aligning said submounts in at least one of fast axis and slow axis direction and parallel to the surface of the planar alignment substrate resulting in parallel emission of each laser light emitter.

25. The high power laser diode as claimed by claim 24, wherein said planar spacer plate comprises a plurality of cut-outs, said stops being formed by a respective edge of said cut-outs, and wherein, by abutment of a respective laser light emitter or of a respective submount to an associated stop, said planar spacer plate aligns said plurality of laser light emitters to each other.

26. The high power laser diode as claimed by claim 25, wherein said cut-outs are provided by an etching process, micro-machining or laser cutting.

27. The high power laser diode as claimed by claim 25, wherein a thickness of said planar spacer plate along said direction of light propagation is such that a fill rate of said output laser beams on a surface of said light collimating means in fast axis direction is less than 100%, more preferably less than 90%, most preferably 50% or 33%, said collimating means being substantially larger than said output laser beams to be collimated.

28. The high power laser diode as claimed by claim 22, wherein said planar alignment substrate is a heatsink having a plurality of upright mounting protrusions and cut-outs being disposed on a base in an alternating manner and at predetermined spacings, said first mounting surfaces and said second mounting surfaces being provided on said upright mounting protrusions.

29. The high power laser diode as claimed by claim 28, wherein a thickness of said planar spacer plate along said direction of light propagation is such that a fill rate of said output laser beams on a surface of said light collimating means in fast axis direction is less than 100%, more preferably less than 90%, most preferably 50% or 33%, said collimating means being substantially larger than said output laser beams to be collimated.

30. A high power laser diode comprising a plurality of laser light emitters, a plurality of light collimating means and a planar substrate means,
each of said laser light emitters defining, in a direction perpendicular to a direction of propagation of an output laser beam, a fast axis y and a slow axis x,
each of said light collimating means being associated with a laser light emitter and configured for collimating said output laser beam at least in said fast axis direction y, and
said planar substrate means comprising a plurality of cut-outs, wherein:
at least one stop is formed by a respective edge of said cut-outs,
by abutment of a respective laser light emitter or of a respective submount used for mounting a laser light emitter to said at least one stop said planar substrate means aligns said plurality of laser light emitters to each other such that the optical axes of said laser light emitters are parallel to each other and defines a predetermined distance between said laser light emitters, and
said planar substrate means extends perpendicular to said direction of propagation for precisely defining a distance between a respective laser light emitter and an associated light collimating means,
wherein each of said laser light emitters is mounted on a submount, said submounts being mounted on a single carrier at predetermined spacings in said fast axis direction y, said stops aligning said submounts in at least one of said fast axis y and said slow axis x direction and parallel to the surface of the single carrier resulting in parallel emission of each laser light emitter,
wherein each of said laser light emitters is mounted on a submount or heat sink, said submounts or heat sinks being disposed at different levels on a common carrier, said submounts or heat sinks being disposed along a half-circle at equiangular distances on said common carrier, central beam deflecting means being disposed at a center of said half-circle for deflecting said output laser beams in slow axis direction.

* * * * *